United States Patent
Yan et al.

(10) Patent No.: US 12,497,413 B2
(45) Date of Patent: Dec. 16, 2025

(54) COMPOUND AND ORGANIC ELECTROLUMINESCENCE DEVICE CONTAINING THE COMPOUND

(71) Applicant: GUANGDONG AGLAIA OPTOELECTRONIC MATERIALS CO., LTD, Guangdong (CN)

(72) Inventors: Liangliang Yan, Foshan (CN); Shaofu Chen, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 876 days.

(21) Appl. No.: 17/777,026

(22) PCT Filed: Sep. 19, 2020

(86) PCT No.: PCT/CN2020/116334
§ 371 (c)(1),
(2) Date: May 14, 2022

(87) PCT Pub. No.: WO2021/103769
PCT Pub. Date: Jun. 3, 2021

(65) Prior Publication Data
US 2023/0015881 A1    Jan. 19, 2023

(30) Foreign Application Priority Data
Nov. 25, 2019   (CN) .......................... 201911161572.7

(51) Int. Cl.
| | | |
|---|---|---|
| C07D 519/00 | (2006.01) |
| C07D 471/04 | (2006.01) |
| H10K 85/60 | (2023.01) |
| H10K 50/11 | (2023.01) |
| H10K 50/18 | (2023.01) |
| H10K 101/00 | (2023.01) |
| H10K 101/10 | (2023.01) |

(52) U.S. Cl.
CPC ......... *C07D 519/00* (2013.01); *C07D 471/04* (2013.01); *H10K 85/6572* (2023.02); *H10K 85/6574* (2023.02); *H10K 85/658* (2023.02); *H10K 50/11* (2023.02); *H10K 50/18* (2023.02); *H10K 2101/10* (2023.02); *H10K 2101/90* (2023.02)

(58) Field of Classification Search
CPC ................ C07D 519/00; C07D 471/04; H10K 85/6572; C09K 2211/1044
See application file for complete search history.

(56) References Cited

U.S. PATENT DOCUMENTS

| | | | |
|---|---|---|---|
| 9,755,153 B2 | 9/2017 | Jung | |
| 9,780,313 B2 | 10/2017 | Kim et al. | |
| 2011/0260138 A1* | 10/2011 | Xia | H10K 85/6572 548/440 |
| 2012/0153268 A1* | 6/2012 | Kawamura | H10K 85/6572 257/E51.026 |
| 2012/0319087 A1* | 12/2012 | Lee | C07D 409/10 546/77 |
| 2014/0239263 A1* | 8/2014 | Kim | C07D 471/04 546/121 |
| 2015/0336937 A1* | 11/2015 | Lee | C07D 471/04 544/216 |
| 2016/0118592 A1* | 4/2016 | Park | H10K 50/155 257/40 |

FOREIGN PATENT DOCUMENTS

| | | | | |
|---|---|---|---|---|
| CN | 104672228 A | | 6/2015 | |
| CN | 104672229 A | * | 6/2015 | ............. C09K 11/06 |
| WO | 2016003171 A1 | | 1/2016 | |

OTHER PUBLICATIONS

FIT translation of CN_104672229_A_I (Year: 2025).*

* cited by examiner

*Primary Examiner* — Michael M Dollinger
(74) *Attorney, Agent, or Firm* — Maschoff Brennan

(57) ABSTRACT

The present invention relates to a compound and an organic light-emitting device containing the compound. The compound has a structure as shown in Formula (1), where X is selected from the group consisting of: O, S, Se, $CR_3R_4$, $SiR_5R_6$, $GeR_7R_8$ and $BR_9$. The compound can be used in organic light-emitting devices, particularly as a host material or a hole blocking layer material in an emitting layer of a device or both as the host material and hole blocking layer material simultaneously. Moreover, the compound can provide a higher luminous efficiency for a device, especially has the advantages such as a longer service life of a device, and has the possibility to be applied to the AMOLED industry.

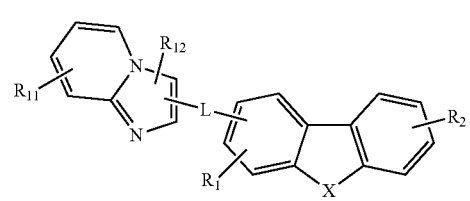

(1)

20 Claims, No Drawings

COMPOUND AND ORGANIC ELECTROLUMINESCENCE DEVICE CONTAINING THE COMPOUND

TECHNICAL FIELD

The present invention relates to the technical field of organic electroluminescence, and in particular to a dibenzoheterocycle organic compound of imidazo[1,2-a]pyridine and an application thereof in an organic light-emitting device.

BACKGROUND

At present, the organic light-emitting device (OLED), as a new generation of display technology, has achieved more and more attention in the aspect of display and lighting technology and has wide application prospect. But, compared with the demands for market application, the luminous efficiency, driving voltage, service life and other properties of the OLED device still need to be strengthened and improved.

Generally, the basic structure of OLED device is to sandwich various functions of organic functional material films between metal electrodes, just like a sandwiched structure. Driven by electric current, holes and electrons are injected from cathode and anode respectively, and then compounded on a light-emitting layer after moving a certain distance, then released in a form of light or heat, thus producing the light emission of OLED. However, organic functional materials are core components of the organic light-emitting device. The material heat stability, photochemical stability, electrochemical stability, quantum yield, film-forming stability, crystallinity, color saturation and the like are the major indicators to influence the performances of the device.

Generally, organic functional materials include fluorescent materials and phosphorescent materials. Fluorescent materials are usually small organic materials, and only utilize 25% singlet state for emitting light generally and thus, have lower luminous efficiency. Due to spin-orbit coupling caused by heavy atoms effect, phosphorescent materials can further utilize 75% triplet exciton energy besides the 25% singlet state and thus, have improved luminous efficiency. But compared with fluorescent materials, phosphorescent materials are put into use relatively late; meanwhile, a host material is matched with a phosphorescent material generally during use process, thus achieving the maximum utilization of the performances of the phosphorescent material. Therefore, there is a higher demand for the host material and materials of organic film layers, such as hole blocking and electron blocking layers, adjacent to the light-emitting layer. It is a challenging topic to choose to be in combination with OLED functional materials or materials with higher development performances, thus achieving high efficiency, low voltage, and long service life of the device. U.S. Pat. No. 9,780,313 has disclosed that a compound with imidazo[1,2-a]pyridine linked to carbazole is used as a single subject in an OLED device, but the device shows not too ideal efficiency and service life and thus, is to be further improved.

SUMMARY

Directed to the above problems in the prior art, the inventor provides a dibenzoheterocycle organic compound containing imidazo[1,2-a]pyridine and an application thereof in an organic light-emitting device. The compound of the present invention has a higher glass transition temperature and higher optical, electric and thermal stability. The compound of the present invention can provide improved luminous efficiency and service life of device and lower starting voltage when used in an OLED device and thus, has the possibility of being applied in OLED industry.

To achieve the above objectives, the present invention adopts the following technical solution:

A dibenzoheterocycle organic compound containing imidazo [1,2-a]pyridine, where the organic compound has a structure as shown in Formula 1:

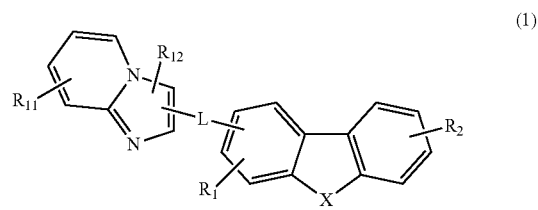

(1)

where X is selected from the group consisting of: O, S, Se, $CR_3R_4$, $SiR_5R_6$, $GeR_7R_8$ and $BR_9$;

where $R_1$, $R_2$, $R_{11}$ and $R_{12}$ are zero substitution to a maximum possible number of substitutions; in case of polysubstitution, 2 adjacent substitutions are capable of being linked with each other to form a fused ring structure with Formula 1;

where $R_1$-$R_9$, at each occurrence, are independently selected from hydrogen, deuterium, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl; and $R_2$ is not hydrogen;

where $R_{11}$-$R_{12}$, at each occurrence, are independently selected from hydrogen, deuterium, halogen, substituted or unsubstituted C1-C10 alkyl, substituted or unsubstituted C1-C10 heteroalkyl, substituted or unsubstituted C6-C30 aralkyl, substituted or unsubstituted C1-C10 alkoxy, substituted or unsubstituted C6-C30 aryloxy, amino, substituted or unsubstituted C3-C30 silicyl, substituted or unsubstituted C6-C30 aryl, substituted or unsubstituted C1-C30 heteroaryl, cyano, nitrile, isonitrile and phosphino;

where $R_3$ and $R_4$, $R_5$ and $R_6$, $R_7$ and $R_8$ are bonded directly or bonded via O, Si and $NR_3$ to form a fused ring;

where L, at each occurrence, is independently selected from substituted or unsubstituted C1-C10 alkylene, substituted or unsubstituted C1-C10 heteroalkylene, substituted or unsubstituted C6-C30 aralkylene, substituted or unsubstituted C1-C10 alkoxylene, substituted or unsubstituted C6-C30 aryloxylene, imino, substituted or unsubstituted C3-C30 silicylene, substituted or unsubstituted C6-C30 arylene, substituted or unsubstituted C2-C30 heteroarylene or phosphinidene that are directly linked to the Formula (1);

where the substitution refers to a substitution by deuterium, halogen, C1-C4 alkyl, C1-C4 alkoxy, C3-C6 cycloalkyl, C6-C18 aryl, C1-C18 heteroaryl, amido substituted by C1-C4 alkyl or amido substituted by C6-C18 aryl.

As a preferred compound, the compound is selected from any one of the following Formulas 2-9:

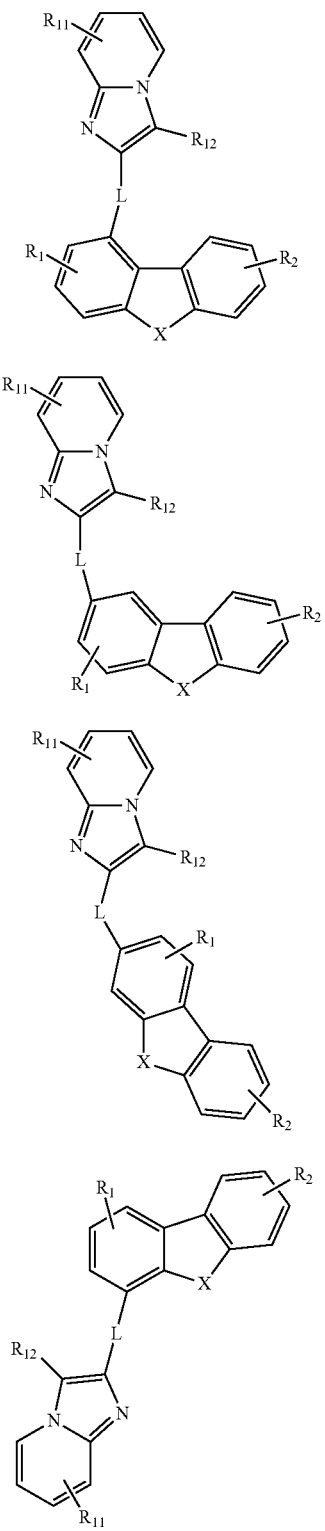

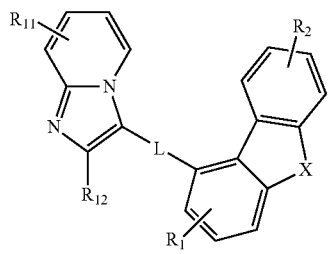

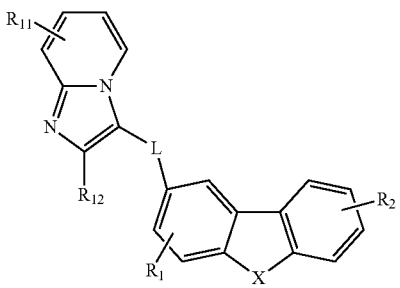

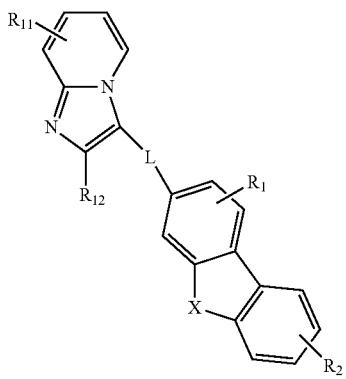

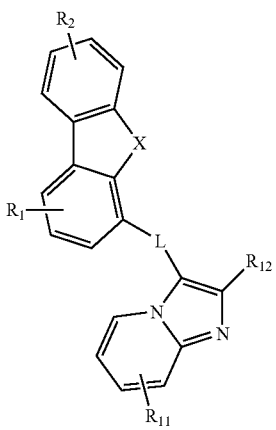

Preferably, $R_1$ is hydrogen; $R_2$ is mono-substitution or adjacent di-substitution; the mono-substitution is substituted or unsubstituted C6-C20 aryl, substituted or unsubstituted C1-C20 heteroaryl; and the di-substitution is substituted or unsubstituted C1-C8 alkyl, substituted or unsubstituted C2-C8 alkenyl, substituted or unsubstituted C6-C10 aryl, substituted or unsubstituted C1-C10 heteroaryl to form a ring via bonding;

$R_{11}$ is hydrogen or mono-substitution or adjacent di-substitution; the mono-substitution is substituted or unsubstituted C6-C20 aryl, substituted or unsubstituted C1-C20 heteroaryl; and the di-substitution is substituted or unsubstituted C1-C8 alkyl, substituted or unsubstituted C2-C8 alkenyl, substituted or unsubstituted C6-C10 aryl, substituted or unsubstituted C1-C10 heteroaryl to form a ring via bonding; and $R_{12}$ is C6-C10 aryl and C1-C10 heteroaryl.

Preferably, the heteroaryl is N heteroaryl; X is selected from the group consisting of: O, S, $CR_3 R_4$, $BR_9$; where $R_3$, $R_4$ and $R_9$ independently represent hydrogen, substituted or unsubstituted C1-C8 alkyl, substituted or unsubstituted C3-C8 cycloalkyl, substituted or unsubstituted C1-C8 heteroalkyl, substituted or unsubstituted C6-C10 aralkyl, and substituted or unsubstituted C6-C10 aryl.

Preferably, $R_3$, $R_4$, and $R_9$ independently represent C1-C4 alkyl or C6-C10 aryl.

As a preferred compound, the compound is selected from any one of the following Formulas 11-26:

(11)
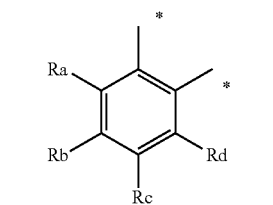

(12)
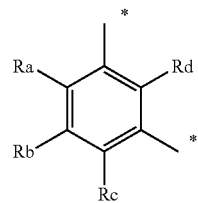

(13)
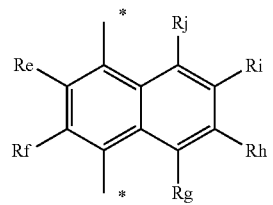

(14)
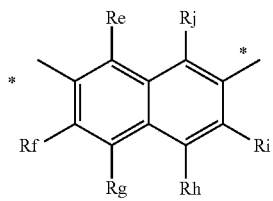

(15)
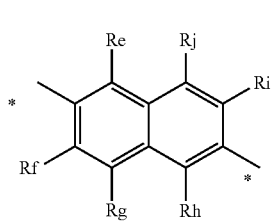

-continued

(16)
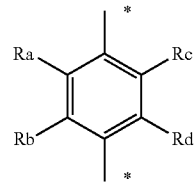

(17)
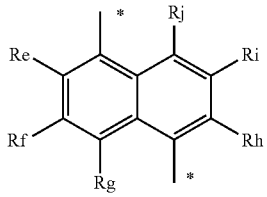

(18)
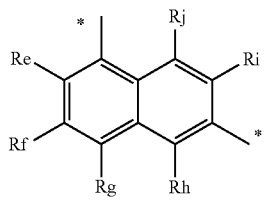

(19)
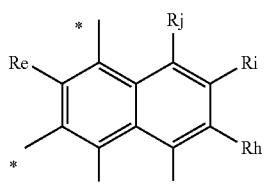

(20)
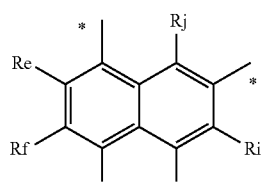

(21)
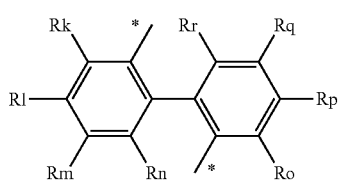

(22)
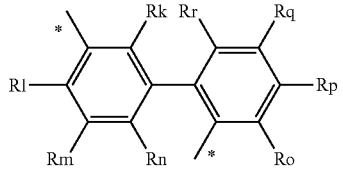

(23)
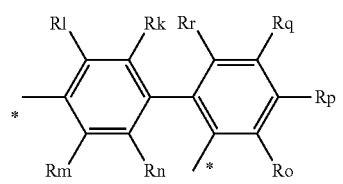

-continued

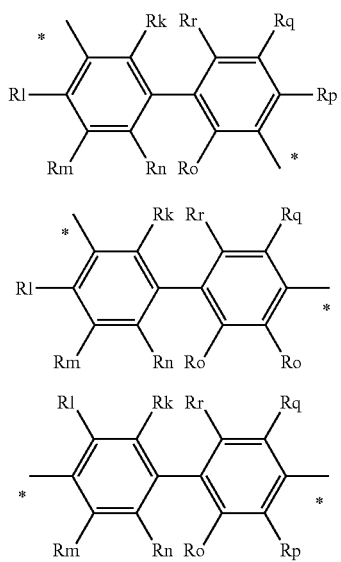

(24)

(25)

(26)

where $R_a$-$R_r$ each independently represent hydrogen, deuterium, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl; or $R_a$-$R_r$ are capable of being bound with each other to form a fused ring structure; the substitution refers to a substitution by deuterium, halogen, C1-C4 alkyl, C1-C4 alkoxy, C3-C6 cycloalkyl, C6-C18 aryl, C1-C18 heteroaryl, amido substituted by C1-C4 alkyl, or amido substituted by C6-C18 aryl.

Preferably, $R_a$-$R_r$ each independently represent hydrogen, C1-C8 alkyl or C6-C10 aryl.

Preferably, $R_a$-$R_r$ each independently represent hydrogen, phenyl or naphthyl. Preferably, $R_{11}$ is H; $R_{12}$ is phenyl, biphenyl or naphthyl.

As a preferred compound, $R_2$ includes a portion of Formula 27:

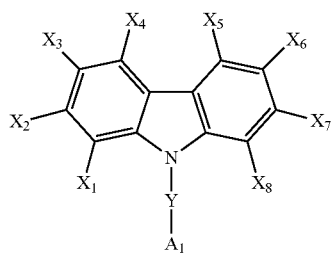

(27)

where $A_1$ represents substituted or unsubstituted C6-C30 aryl, substituted or unsubstituted C1-C30 heteroaryl;
Y represents a single bond or substituted or unsubstituted C6-C30 arylene;
where $X_1$-$X_8$ each independently represent hydrogen, deuterium, halogen, cyano, carboxyl, nitryl, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl, or are linked with each other in adjacent position to form a cyclic structure and to form a fused ring with Formula 27; where the substitution refers to a substitution by deuterium, halogen, C1-C4 alkyl, C1-C4 alkoxy, C3-C6 cycloalkyl, C6-C18 aryl, C1-C18 heteroaryl, amido substituted by C1-C4 alkyl, or amido substituted by C6-C18 aryl;

where the Formula (27) is not substituted but bonded on the Formula 1 directly via at least one of $X_1$-$X_8$ or bonded on the Formula 1 via a group A1.

$X_1$-$X_8$ represent H and at least one of $X_1$-$X_8$ is not substituted but bonded on the Formula 1.

The $A_1$ represents C6-C10 aryl and C1-C10 heteroaryl; Y represents a single bond or C6-C10 arylene.

The $A_1$ represents C phenyl; Y represents a single bond.

A preferred compound is the following compound:

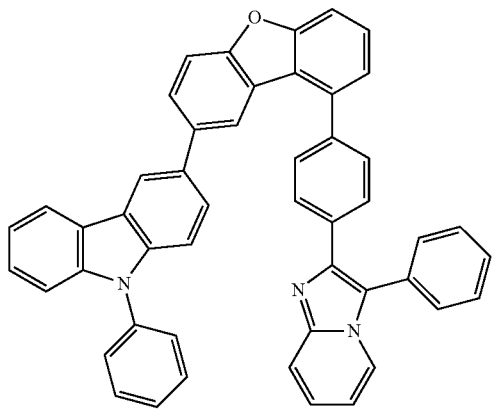

H2-1

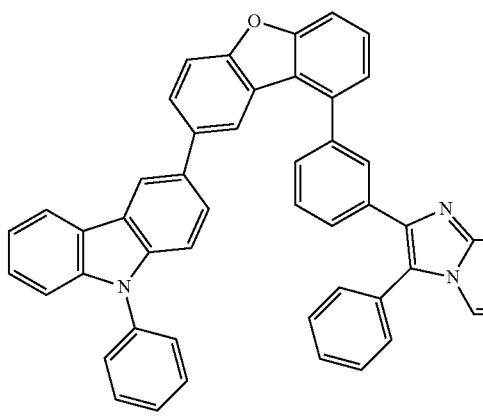

H2-2

H2-3
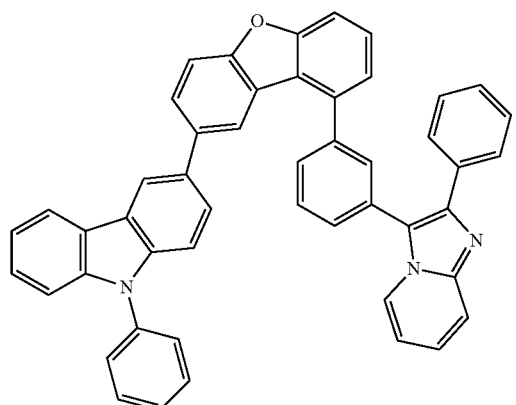
H2-4
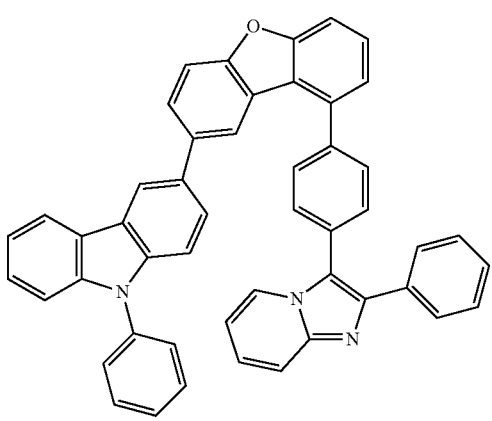
H2-5
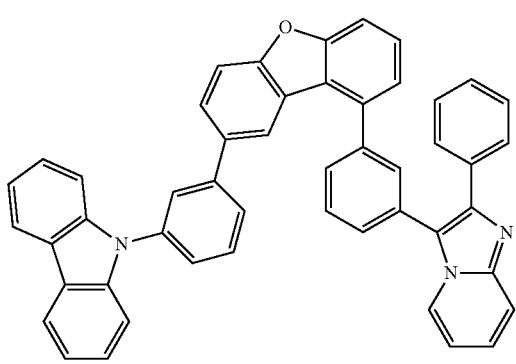
H2-6
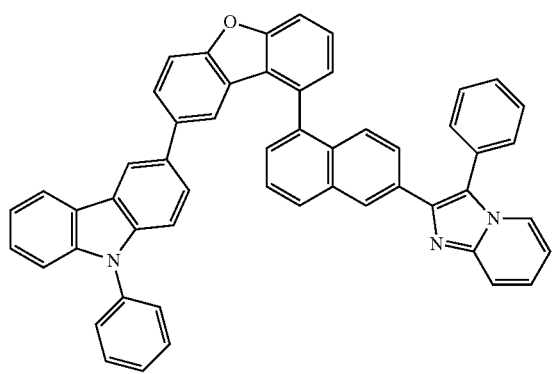
H2-7
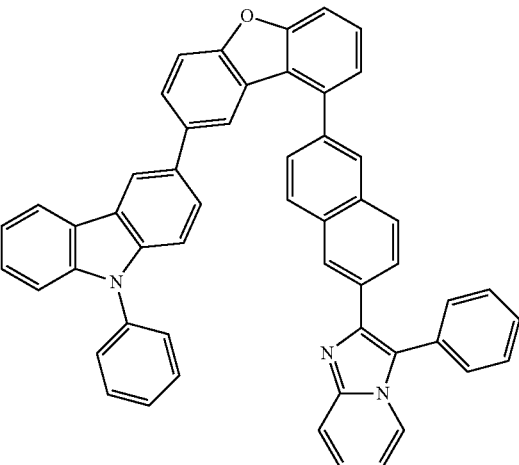
H2-8
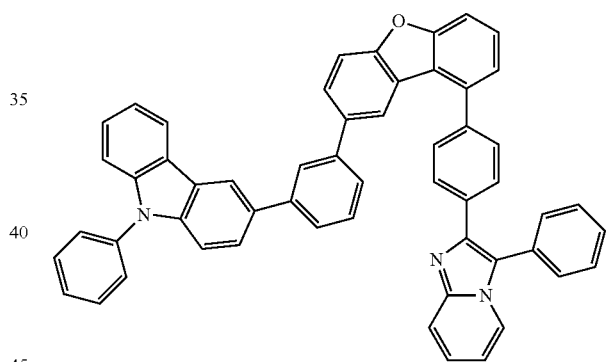
H2-9
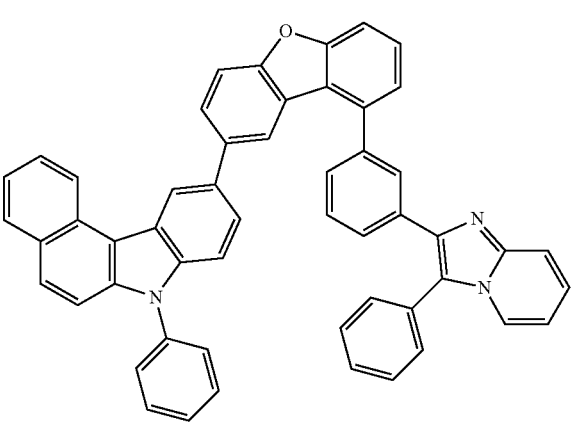

H2-10
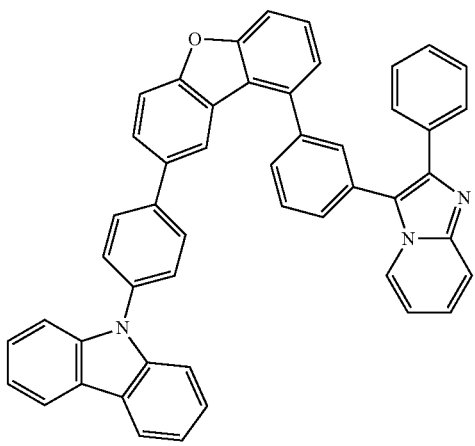
H2-11
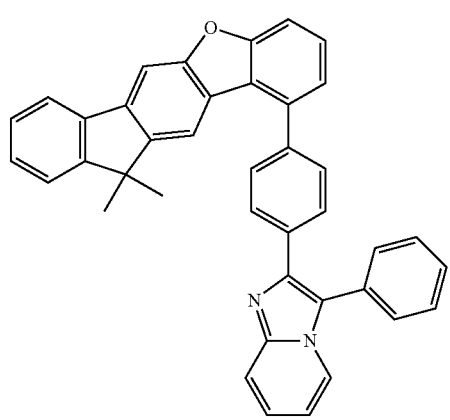
H2-12
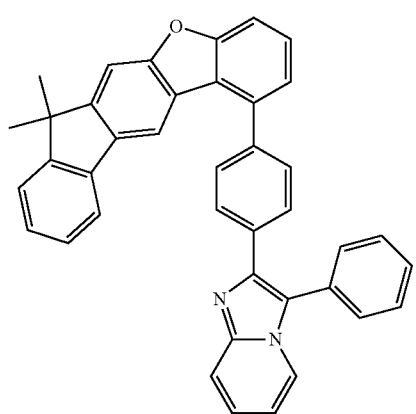
H2-13
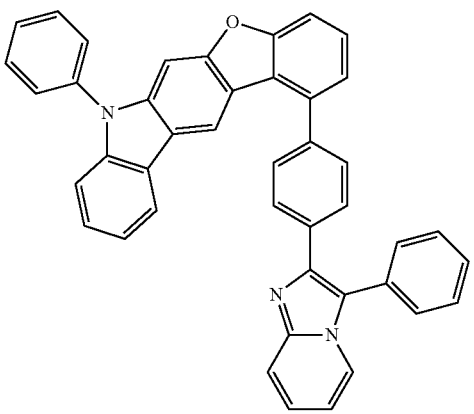
H2-14
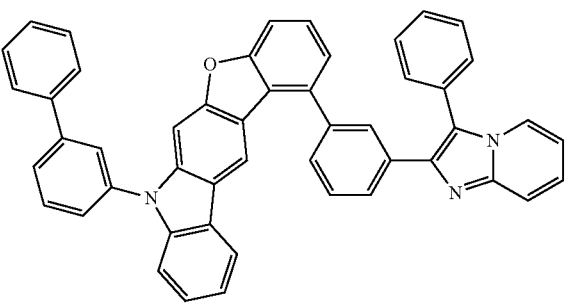
H2-15
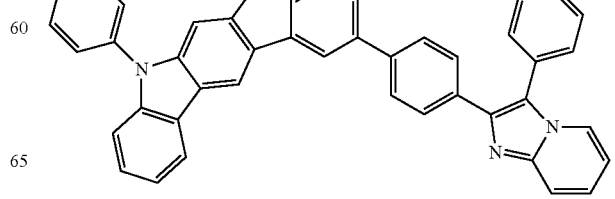
H2-16

-continued
H2-17
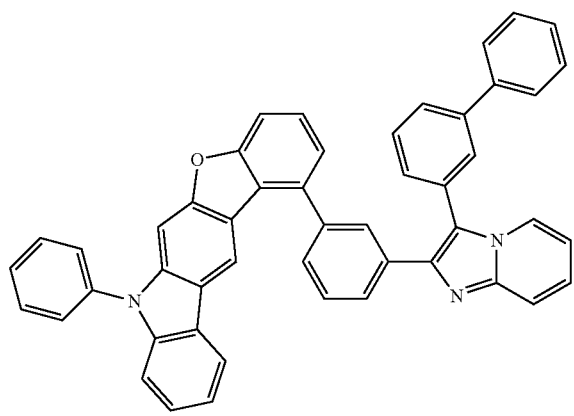
H2-18
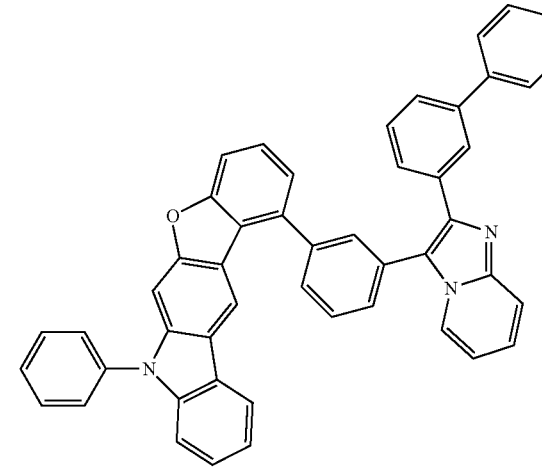
H2-19
-continued
H2-20
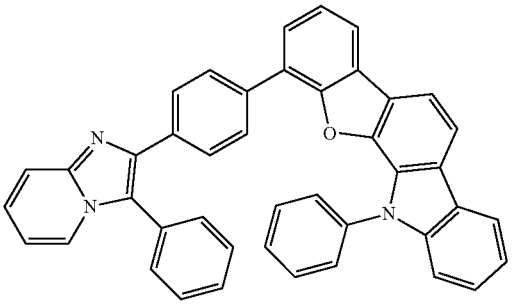
H2-21
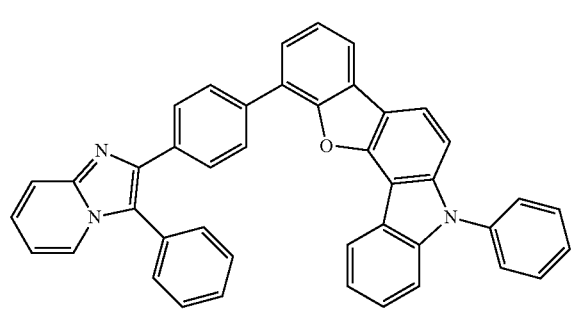
H2-22
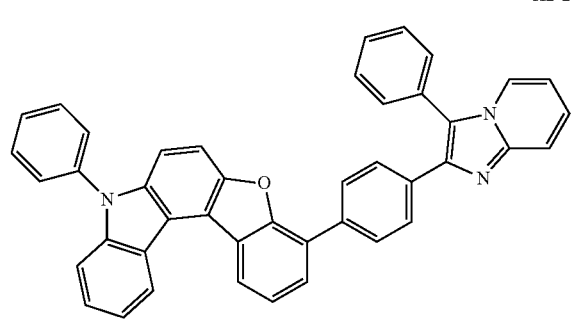
H2-23
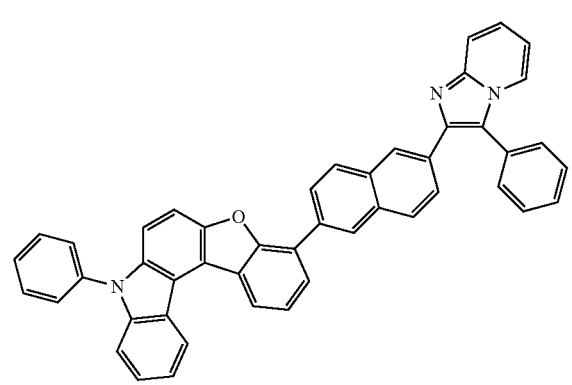

-continued
H2-24
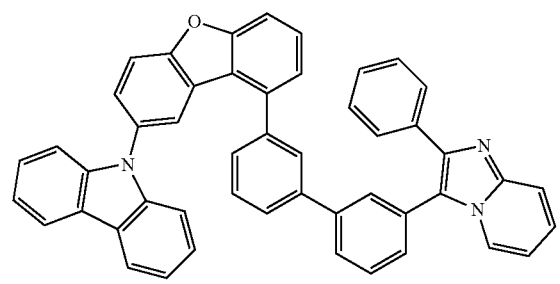
H2-25
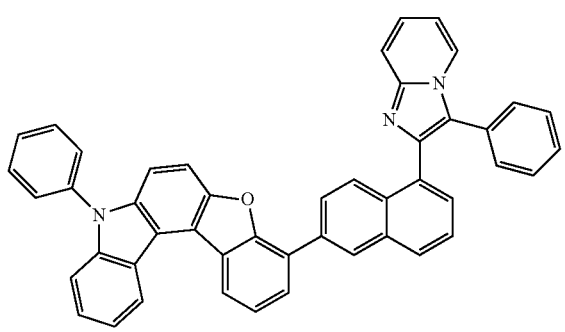
H2-26
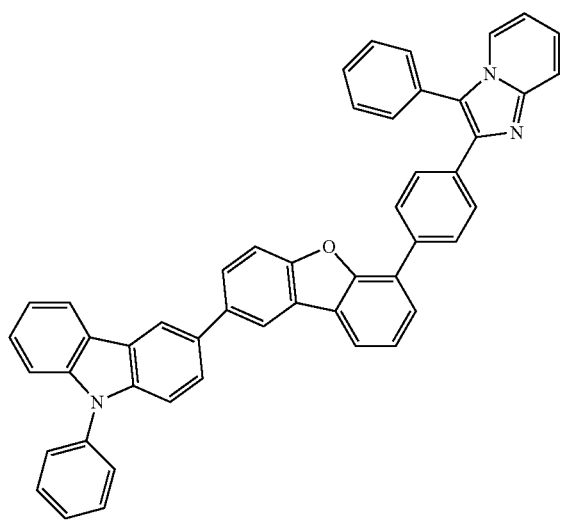
H2-27
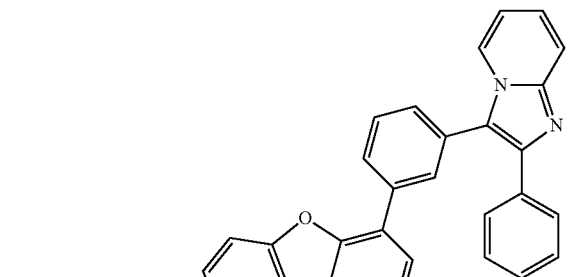
H2-28
H2-29
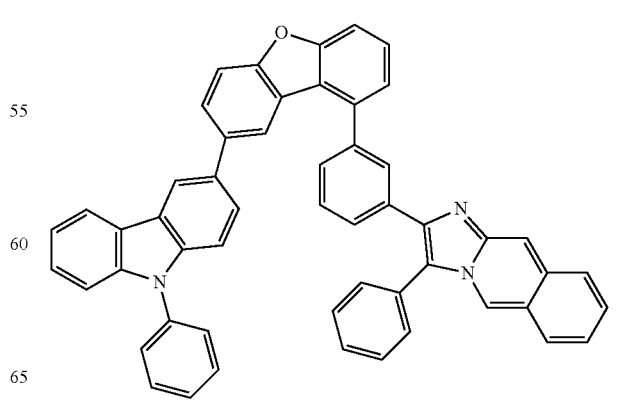

H2-30
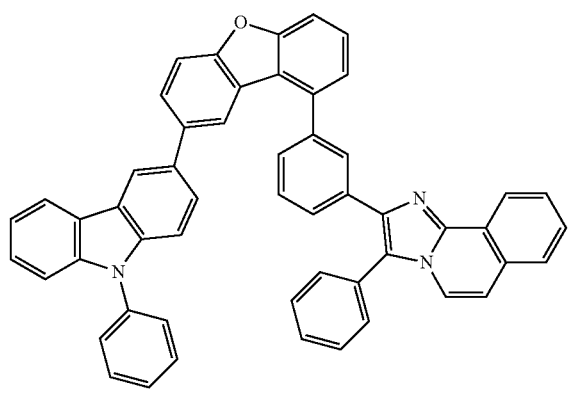
H2-31
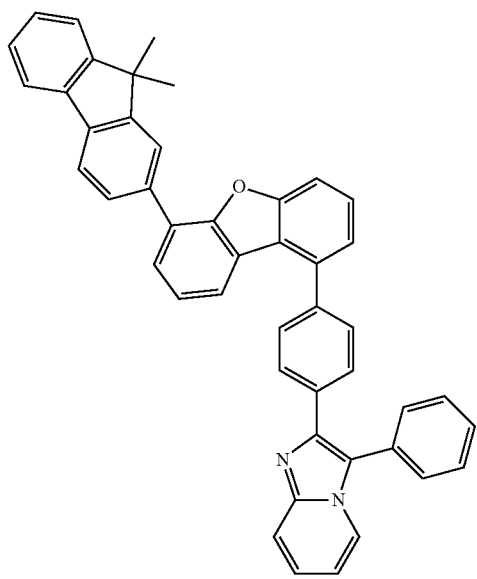
H2-32
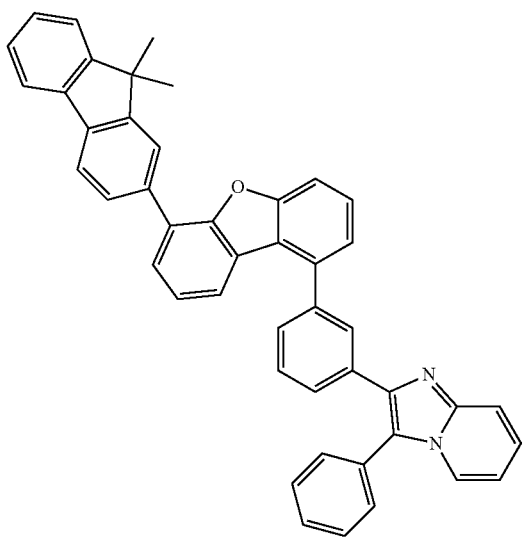
H2-33
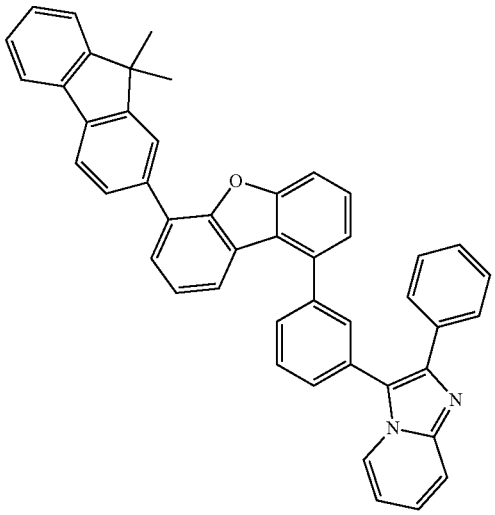
H2-34
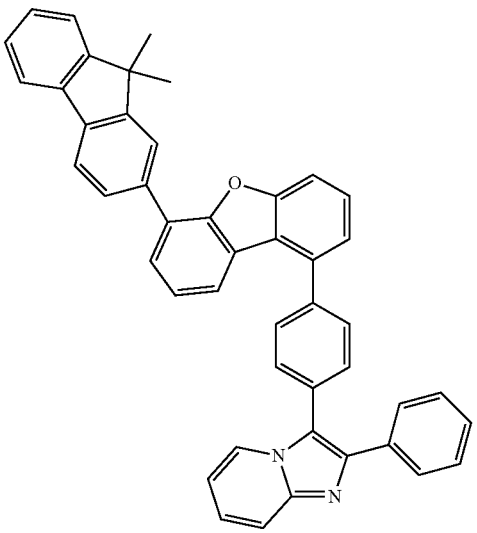
H2-35
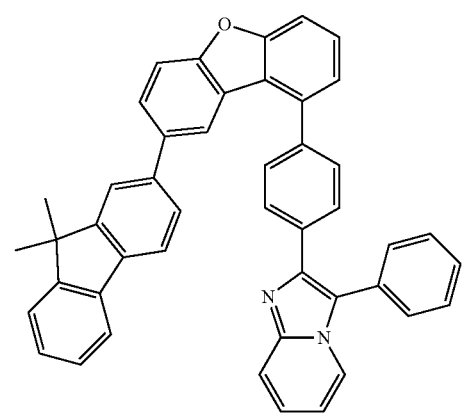

H2-36
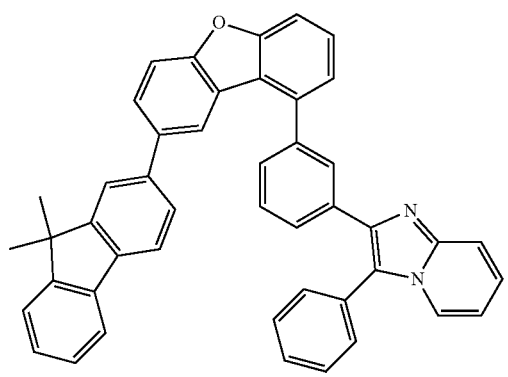
H2-37
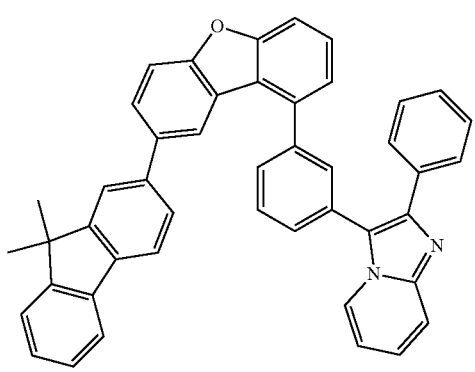
H2-38
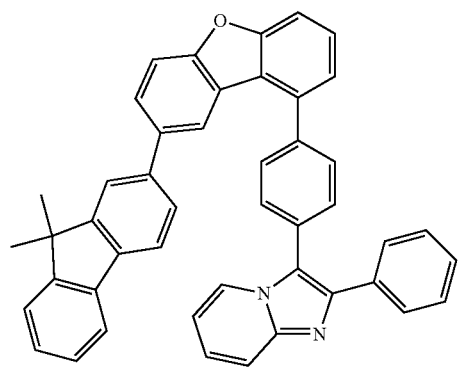
H2-39
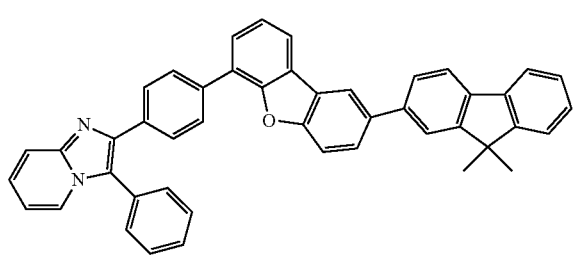
H2-40
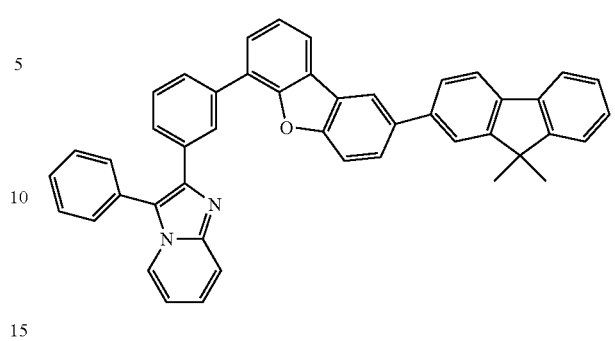
H2-41
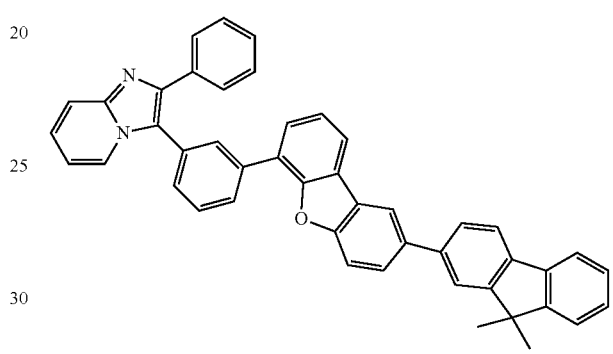
H2-42
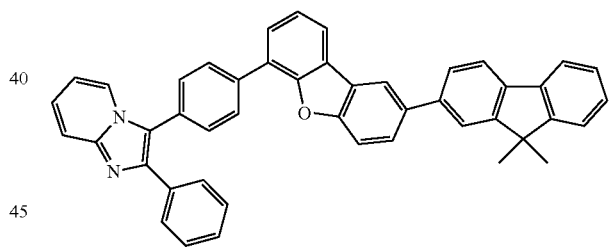
H2-43
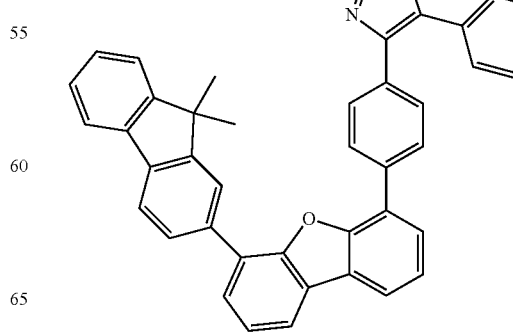

H2-44
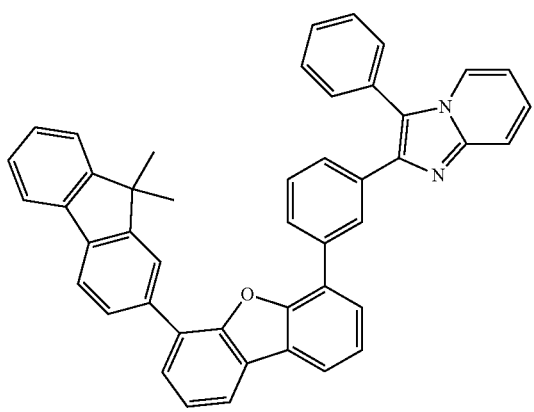
H2-48
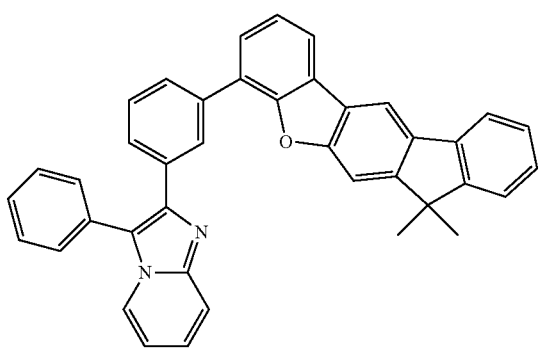
H2-45
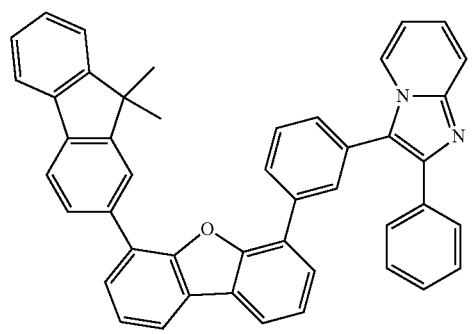
H2-49
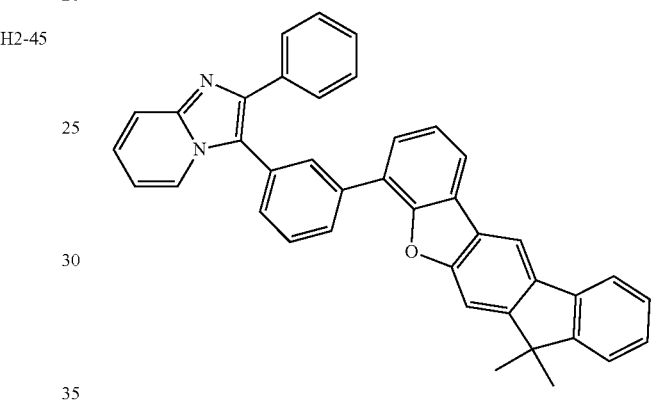
H2-46
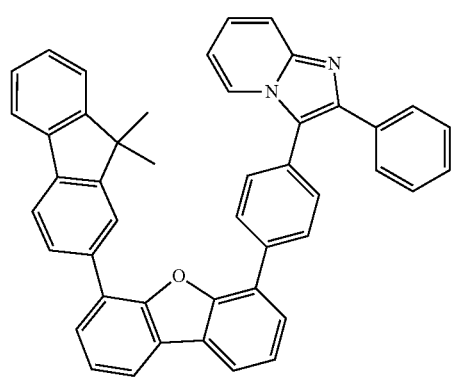
H2-50
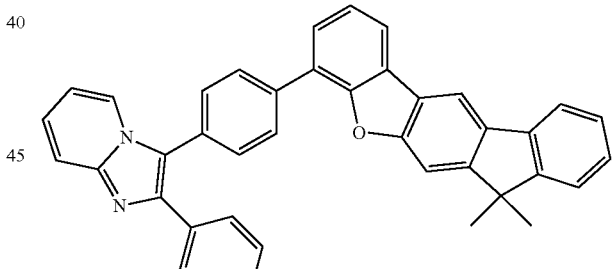
H2-47
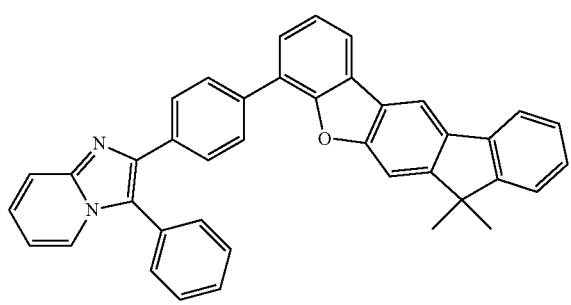
H2-51
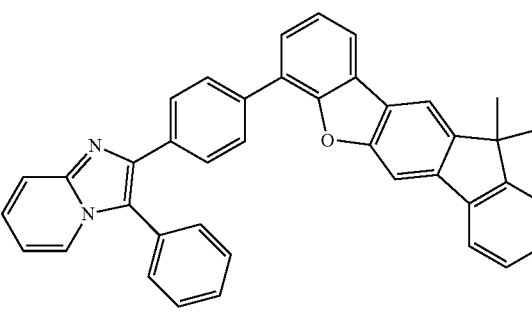

-continued
H2-52
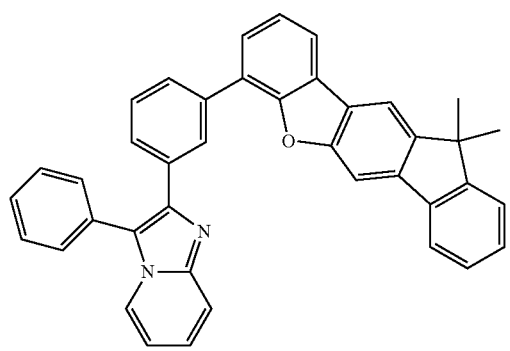
H2-53
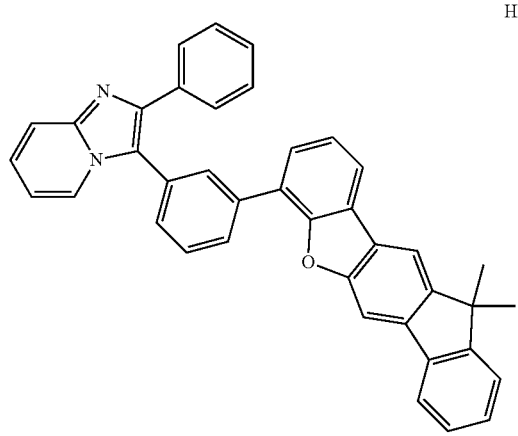
H2-54
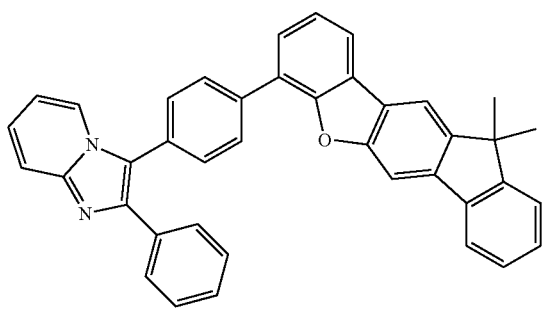
H2-55
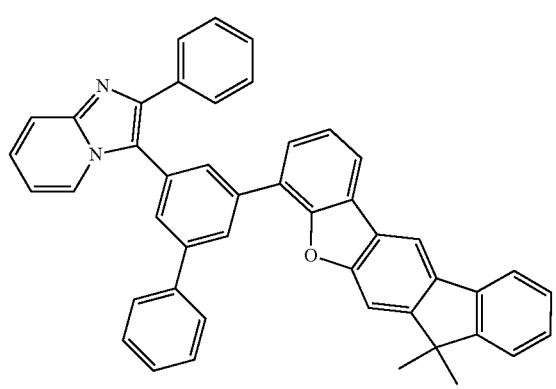
-continued
H2-56
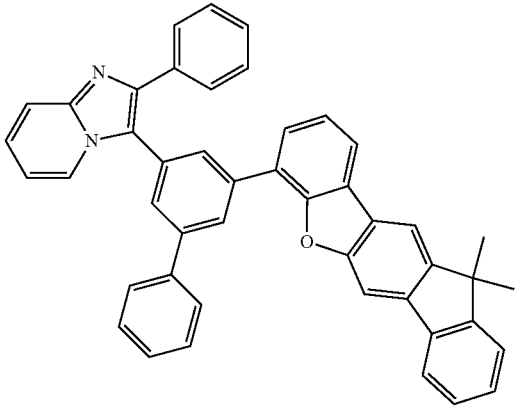
H2-57
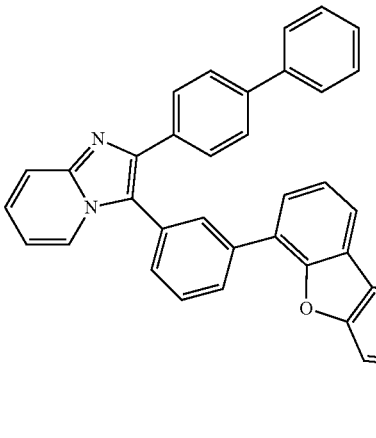
H2-58
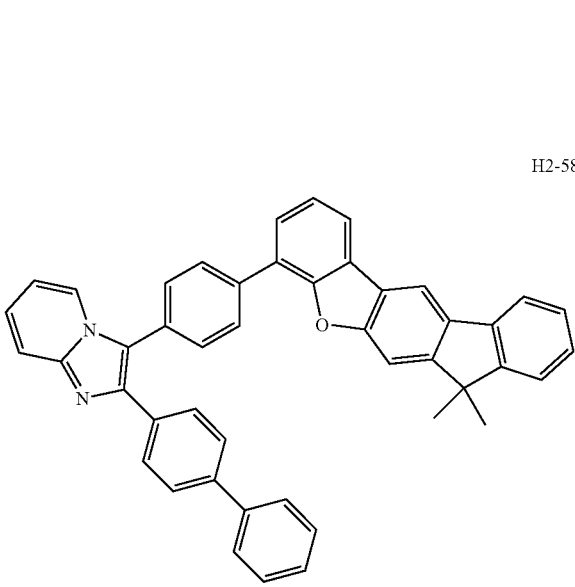

H2-59
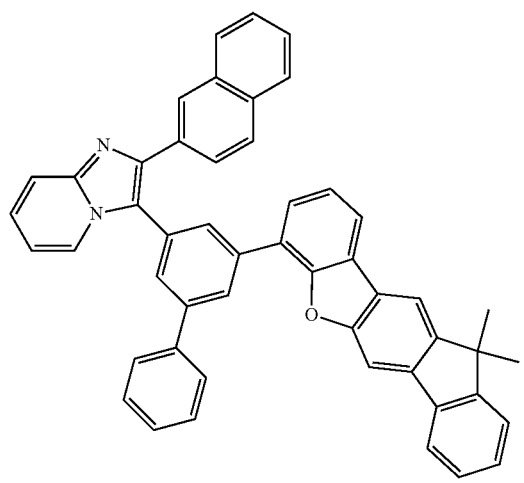
H2-60
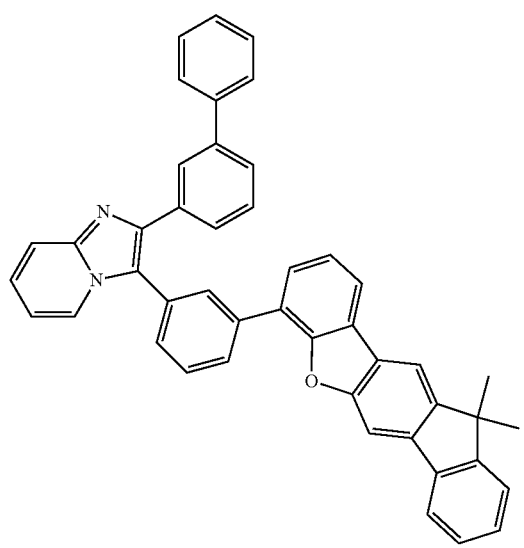
H2-61
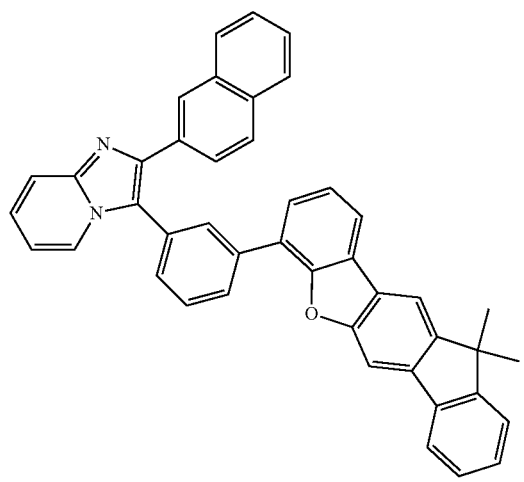
H2-62
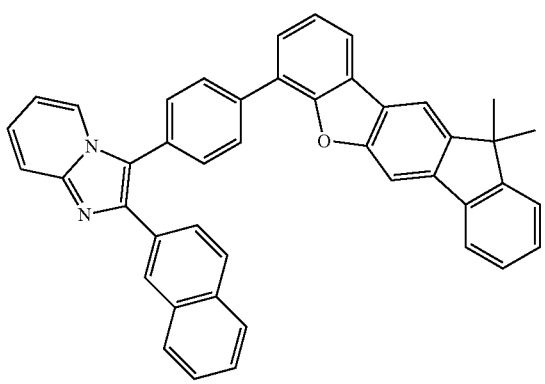
H2-63
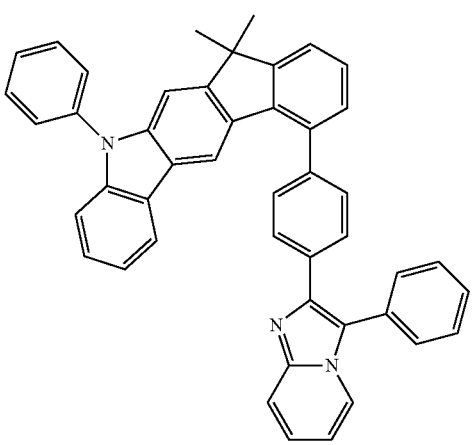
H2-64
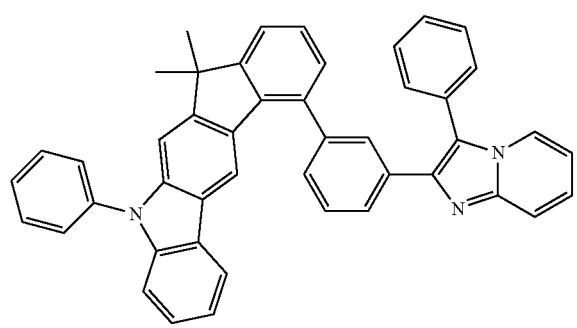
H2-65
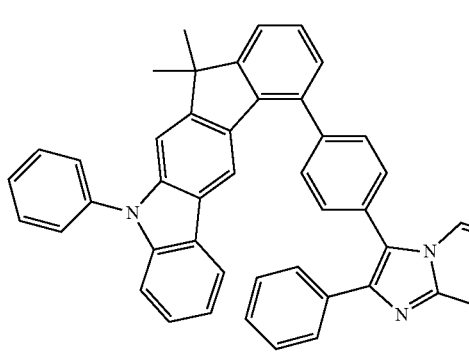

H2-66
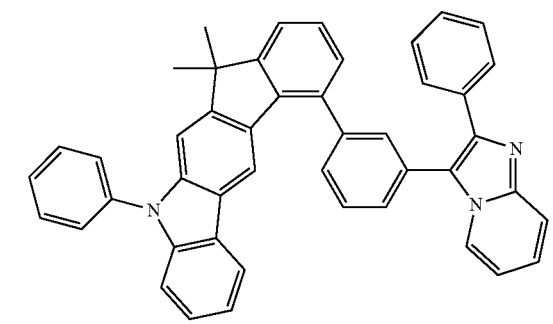
H2-67
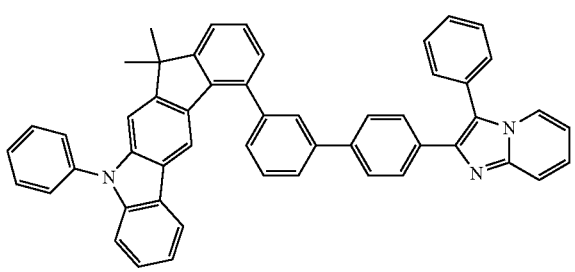
H2-68
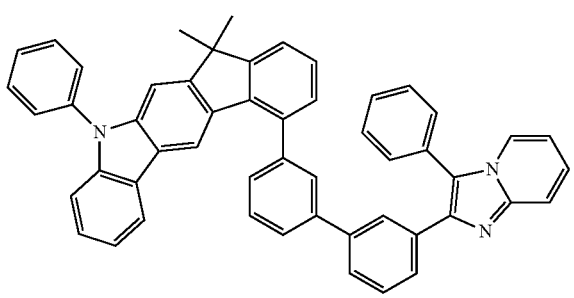
H2-69
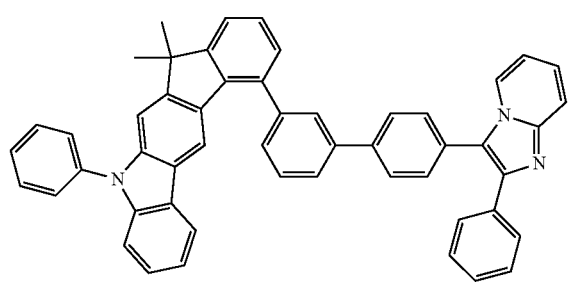
H2-70
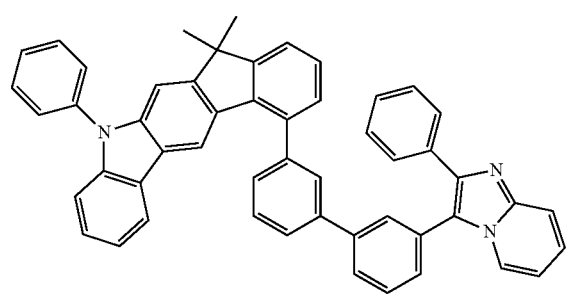
H2-71
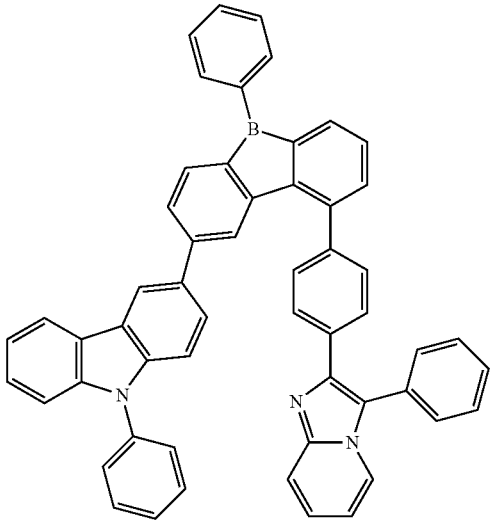
H2-72
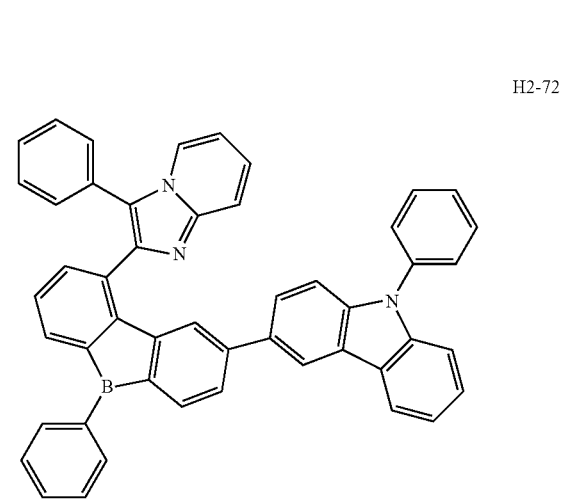
H2-73
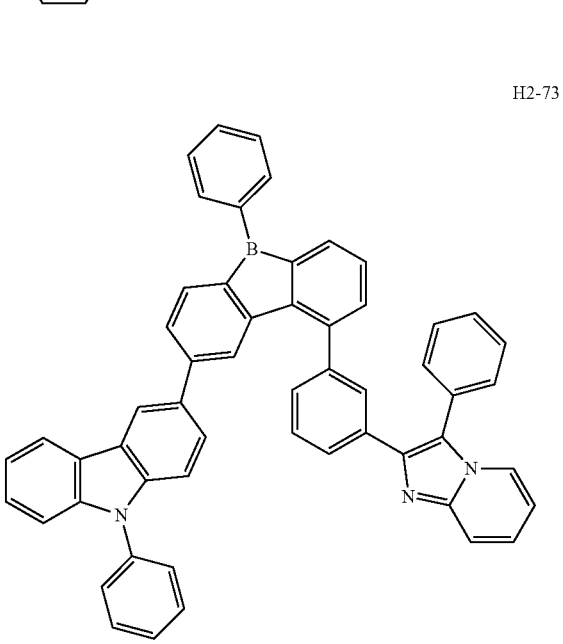

-continued
H2-74
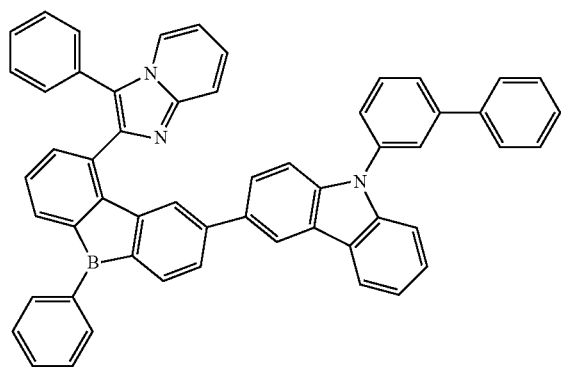
H2-75
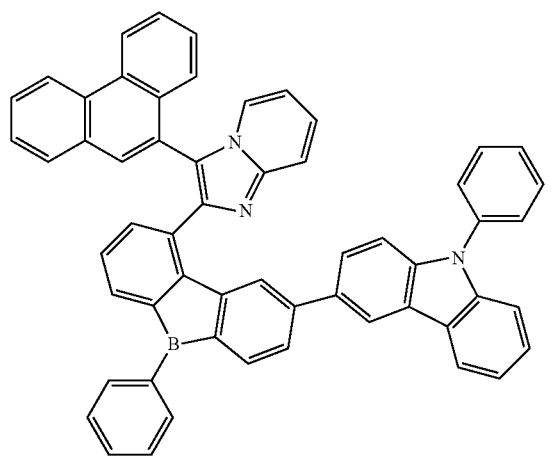
H2-76
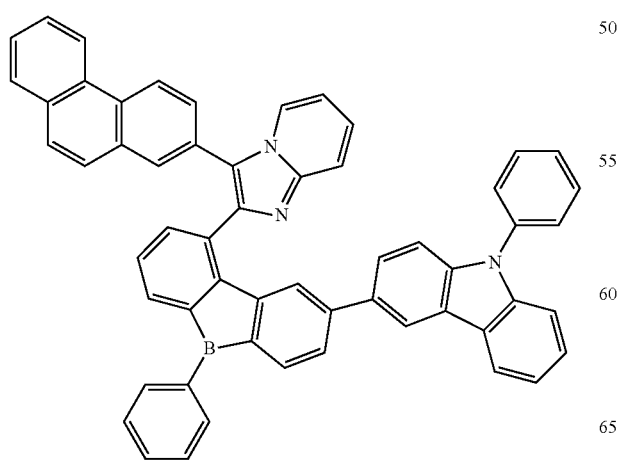
-continued
H2-77
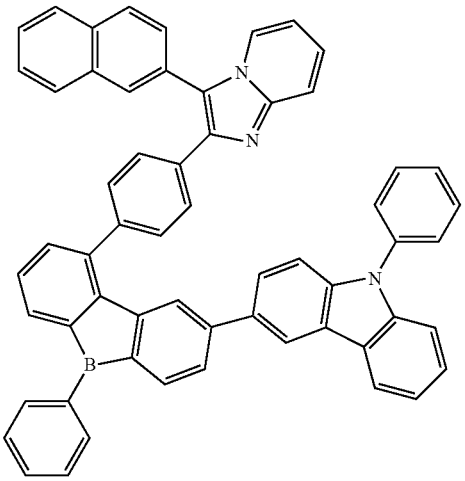
H2-78
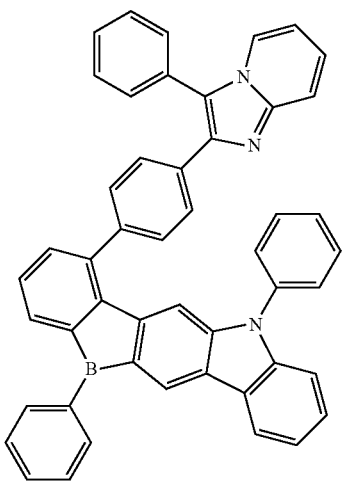
H2-79
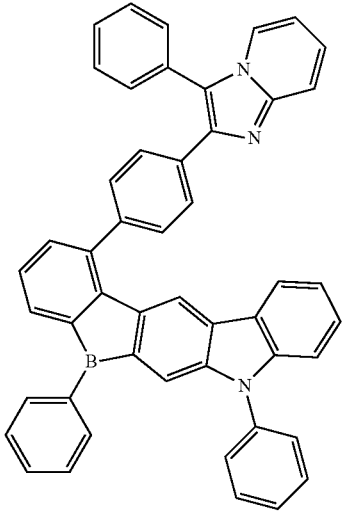

H2-80
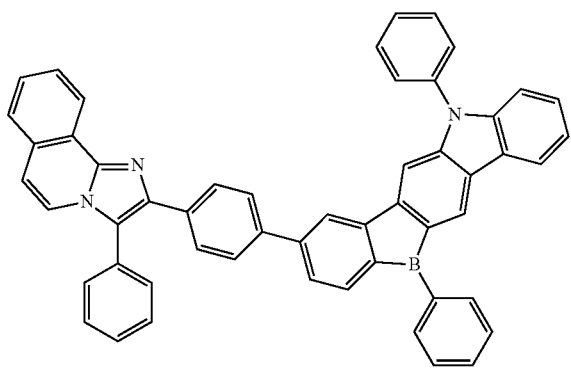

H2-81
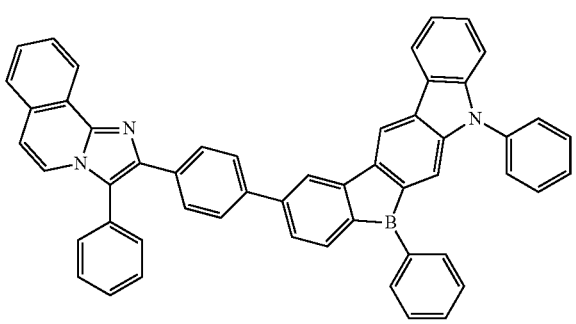

H2-82
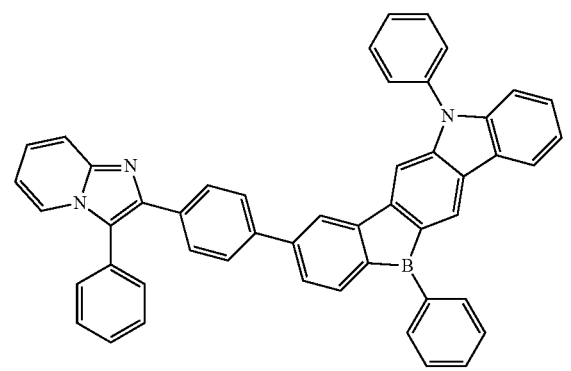

H2-83
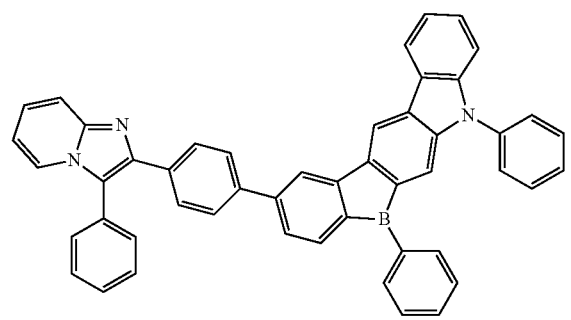

H2-84
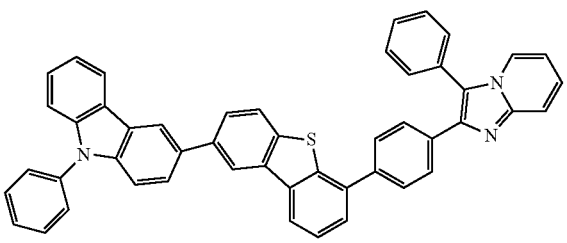

H2-85
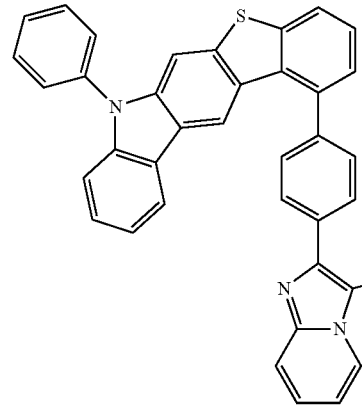

H2-86
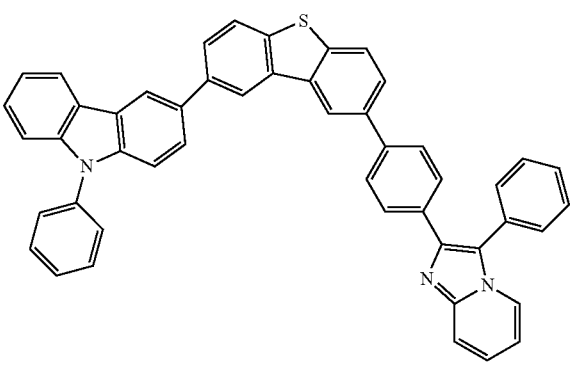

One of the objectives of the present invention is to provide an OLED device containing the above compound.

One of the objectives of the present invention is to provide an OLED device containing the above compound, used as a host material and/or a hole blocking material in the OLED device.

The present invention provides a dibenzoheterocycle organic compound containing imidazo[1,2-a]pyridine and an application thereof in an organic light-emitting device. The compound of the present invention has a higher glass transition temperature and higher optical, electric and thermal stability as well as a higher Eg. The compound of the present invention has better hole-electron balance when used as a main body of the light-emitting layer, beneficial to promoting the service life of the device; the compound of the present invention is beneficial to reducing the diffusion of excitons and promoting the luminous efficiency of the device when used as a hole blocking layer, thus further reducing energy consumption.

EMBODIMENTS (IMPLEMENTATION FOR SYNTHESIS AND DEVICE)

All the examples are merely to facilitate the understanding of the present invention, but are not construed as specifically limiting the scope of the present invention.

Raw materials, solvents and the like related in the compound synthesis of the present invention are purchased from Alfa, Acros and other suppliers known well by a person skilled in the art.

EXAMPLE 1

Synthesis of a Shared Intermediate:

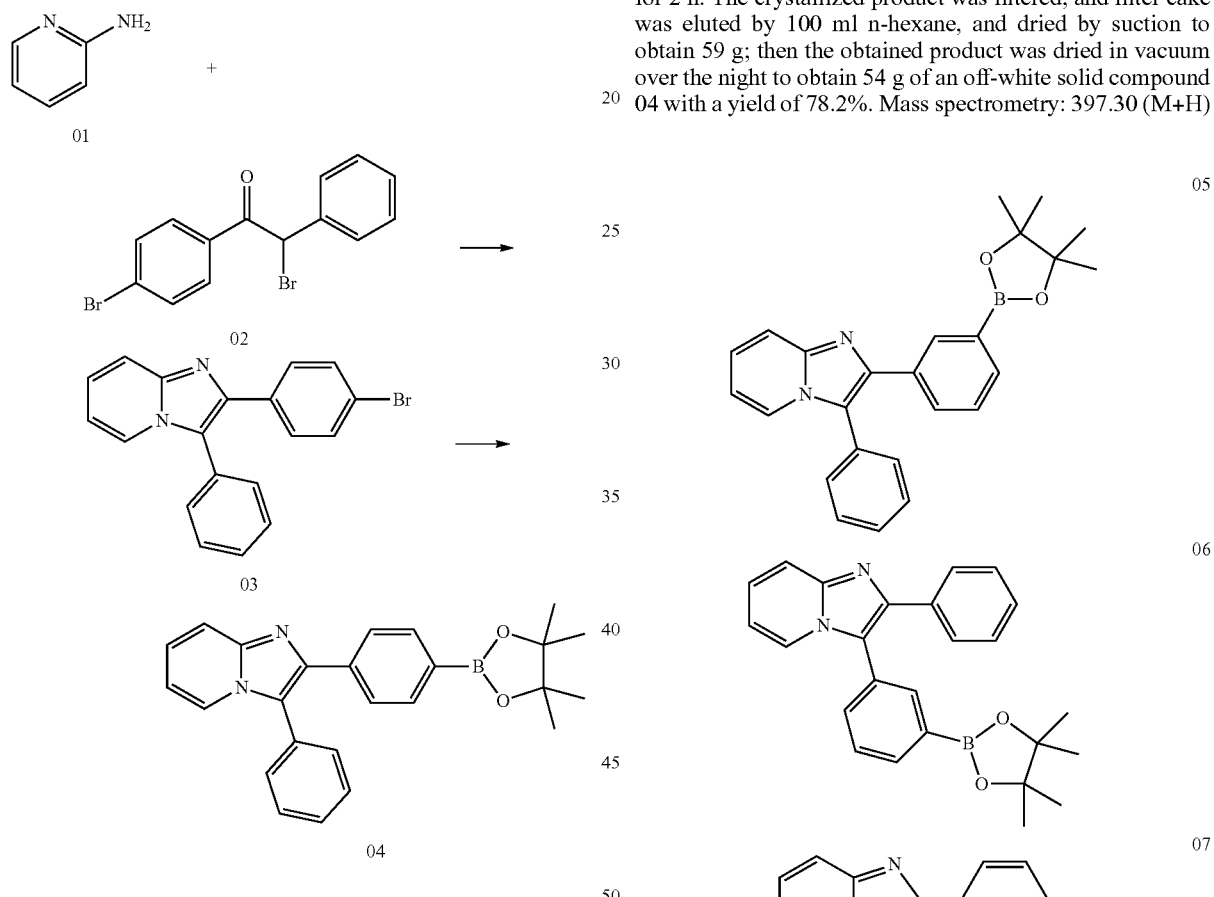

Synthesis of the compound 03: the compound 01 (53.17 g, 0.57 mol, 1.0 eq), compound 02 (200 g, 0.57 mol, 1.0 eq), NaHCO₃ (94.9 g, 1.14 mol, 2.0 eq), and isopropanol (1000 ml) were successively fed to a 2 L single-necked flask, and heated up to 80° C. around in an oil bath, then subjected to heat preservation and stirred under reflux for 7 h, and sampling was performed, and completion of the reaction of raw materials was monitored by TLC. The reaction system was cooled and dropwisely added with deionized water, then stirred for 4 h around and subjected to suction filtration. Solid was beaten with ethanol, subjected to suction filtration and dried to obtain 157 g of a white solid compound 03 with a yield of 79.6%. Mass spectrometry: 349.03 (M+H)

Synthesis of the compound 04: the compound 03 (60 g, 171.81 mmol, 1.0 eq), bis(pinacolato)diboron (56.72 g, 223.35 mmol, 1.3 eq), Pd(dppf)Cl₂ (1.26 g, 1.72 mmol, 0.01 eq), CH₃COOK (33.72 g, 343.62 mmol, 2.0 eq) and 600 ml dioxane were successively added to a 1 L single-necked flask, and replaced with nitrogen for 3 times under stirring conditions, then heated for reflux for 3 h. The completion of the reaction was monitored by TLC (EA/Hex=1:8). The reaction liquid was cooled to room temperature, and dioxane was subjected to vacuum concentration until no solution was distilled off; then 600 ml DCM was added to dissolve solid, and the dissolved solid was washed with 200 ml water for once; then the aqueous phase was extracted for once with 200 ml DCM; organic phases were combined and washed with water for twice (200 ml each time), and then dried by anhydrous MgSO4. The dried organic phase was sieved by a silica gel filter, and eluted by 300 ml DCM, then concentrated to be 150 ml around only, and added with 500 ml n-hexane to be cooled to room temperature, and crystallized for 2 h. The crystallized product was filtered, and filter cake was eluted by 100 ml n-hexane, and dried by suction to obtain 59 g; then the obtained product was dried in vacuum over the night to obtain 54 g of an off-white solid compound 04 with a yield of 78.2%. Mass spectrometry: 397.30 (M+H)

Synthesis of the compounds 05/06/07: the compounds 05/06/07 were synthesized by reference to the synthesis way and treatment method of the compound 04 via changing the corresponding raw materials only.

Synthesis of the Compound H 2-1:

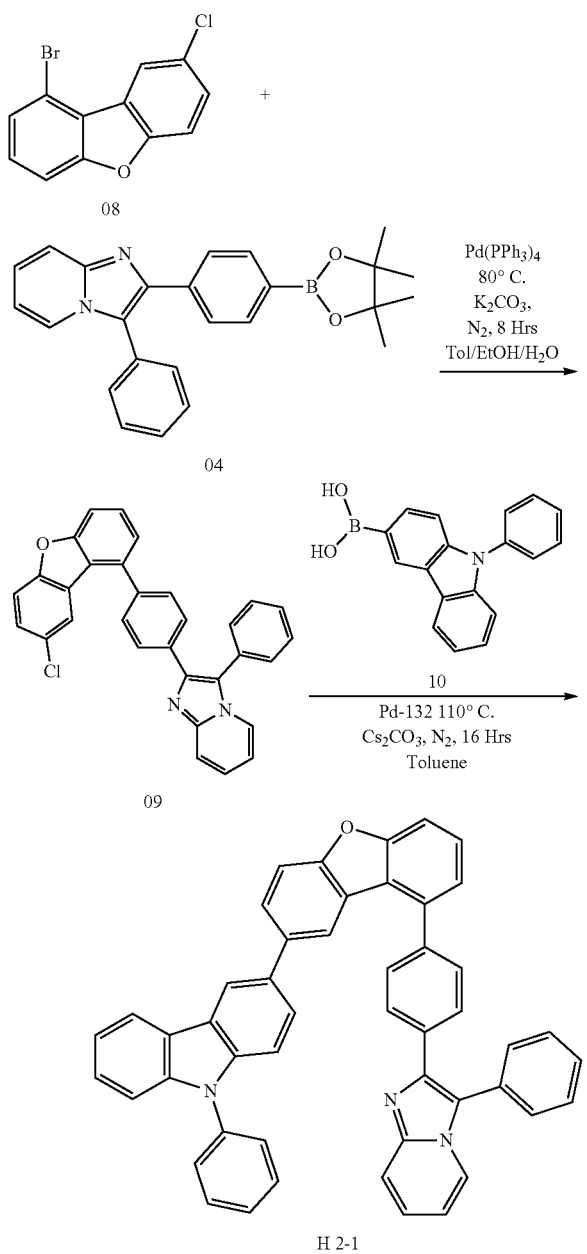

Synthesis of the Compound 09:

The compound 08 (30 g, 106.5 mmol, 1.0 eq), compound 04 (38.01 g, 95.9 mmol, 0.9 eq), Pd(PPh₃)₄ (2.46 g, 2.13 mmol, 0.02 eq), K$_2$CO$_3$ (29.45 g, 213.12 mmol, 2.0 eq), toluene (300 ml), ethanol (60 ml), and H$_2$O (60 ml) were successively added to a 1 L three-necked flask, and vacuumized, then replaced with nitrogen for 3 times, and heated up to 80° C. around in an oil bath and stirred for 8 h; sampling was performed, and completion of the reaction of raw material 04 was monitored by TLC. The reaction system was cooled to room temperature, and added with deionized water (100 ml), then stirred for 0.5 h around and subjected to liquid separation; aqueous phase was extracted by toluene once, and organic phases were combined and washed with water twice (100 ml/times), and dried by anhydrous MgSO$_4$ for 30 min. The organic phase was sieved by a silica gel filter (200-300 meshes, 30 g), and eluted with 150 ml toluene. The organic phase was concentrated to be 120 ml around, then added with 180 ml methanol, and stirred at room temperature for crystallization for 2 h. The crystallized organic phase was filtered, and filter cake was eluted with 30 ml methanol and dried by suction; solid was recrystallized once again according to the above method (120 ml toluene, 180 ml methanol); then the obtained product was dried to obtain 38.2 g of an off-white solid compound 09 with a yield of 76.3%. Mass spectrometry: 471.5 (M+H)

Synthesis of the Compound H 2-1:

The compound 09 (38 g, 80.69 mmol, 1.0 eq), compound 10 (23.17 g, 80.69 mmol, 1.0 eq), Pd-132 (0.857 g, 1.21 mmol, 0.015 eq), Cs2CO3 (52.58 g, 161.38 mmol, 2.0 eq), and toluene (400 ml) were successively added to a 1 L three-necked flask, vacuumized and replaced with nitrogen for 3 times, then heated up to 110° C. around in an oil bath and stirred for 8 h; sampling was performed, and basic completion of the reaction of the raw materials was monitored by TLC. The reaction system was cooled to room temperature, and added with deionized water (150 ml), then stirred for 0.5 h around and subjected to liquid separation; aqueous phase was extracted by toluene once, and organic phases were combined and washed with water twice (150 ml/times), and dried by anhydrous MgSO$_4$ for 30 min The organic phase was sieved by a silica gel filter (200-300 meshes, 40 g), and eluted with 200 ml toluene. The organic phase was concentrated to be 200 ml around, then added with 240 ml methanol, and stirred at room temperature for crystallization for 2 h. The crystallized organic phase was filtered, and filter cake was eluted with 50 ml methanol and dried by suction; solid was recrystallized twice again according to the above method (200 ml toluene, 240 ml methanol); then the obtained product was dried to obtain 29.09 g of a white solid compound H 2-1 with a yield of 53.2%. Mass spectrometry: 678.3(M+H) $^1$H NMR (400 MHz, CDCl$_3$)δ 8.55 (d, 1H), 8.48 (d, 1H), 8.34 (s, 1H), 8.30 (d, 2H), 8.07 (s, 1H), 7.84 (d, 2H), 7.69 (d, 1H), 7.64 (t, J=2.4 Hz, 1H), 7.60 (dq, J=10.0, 5.0 Hz, 5H), 7.53 (m, 2H), 7.49 (dd, J=15.0, 10.0 Hz, 7H), 7.25 (m, 2H), 7.18 (d, J=25.0 Hz, 1H), 7.11 (d, 2H), 6.86 (m, 1H).

Synthesis of the Compound H 2-2:

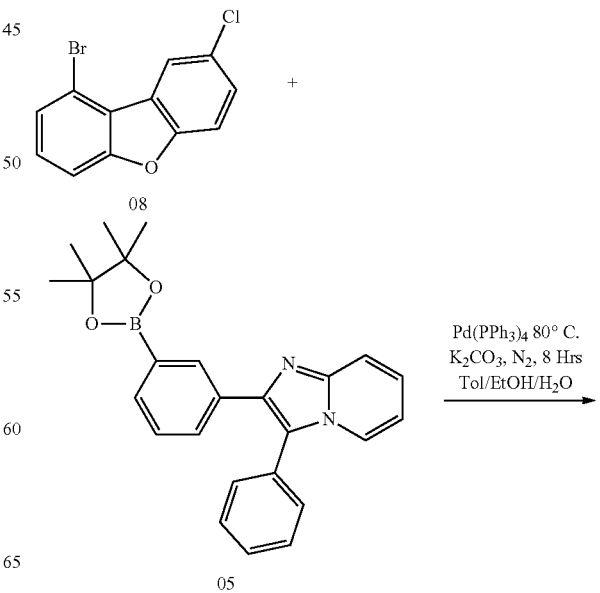

-continued

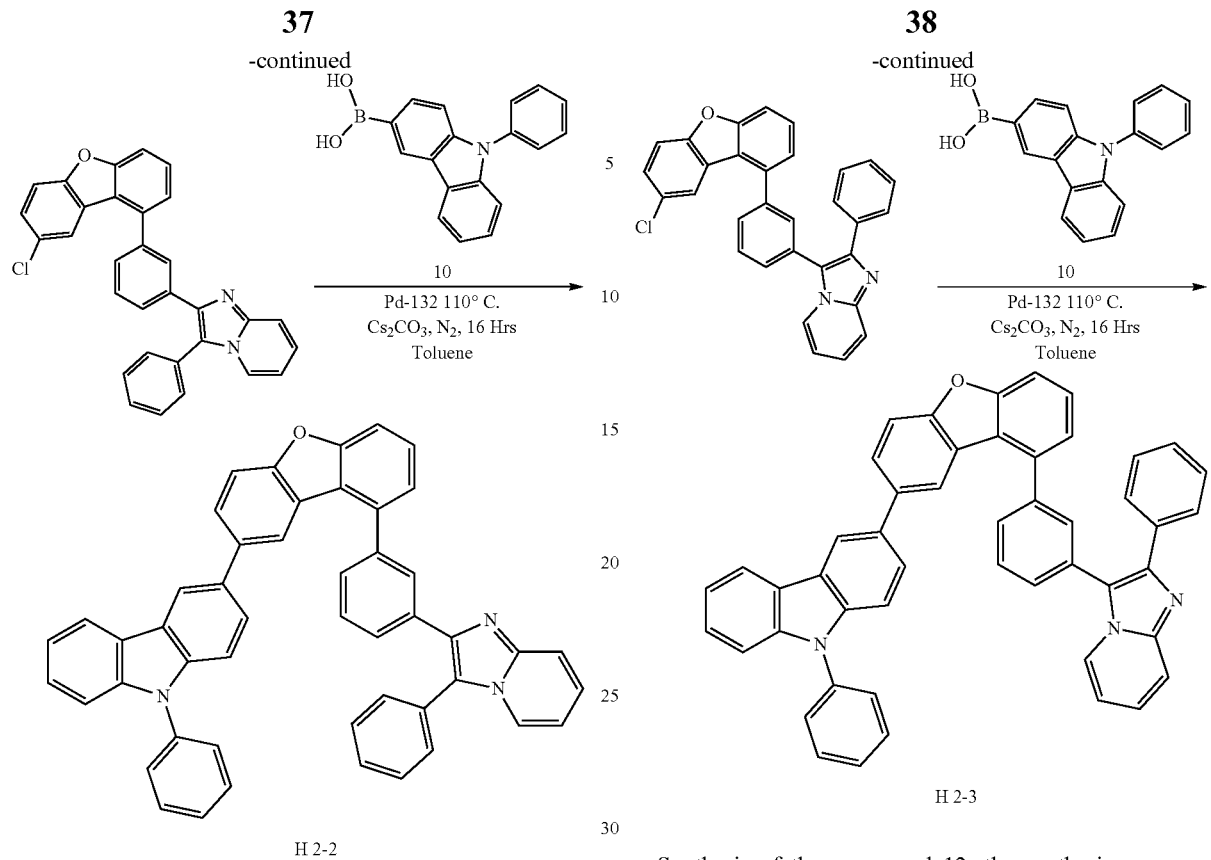

Synthesis of the compound 11: the synthesis was performed by reference to the synthesis way and treatment method of the compound 09 via changing the corresponding raw materials only.

Synthesis of the compound H 2-2: the synthesis was performed by reference to the synthesis way and treatment method of the compound H 2-1 via changing the corresponding raw materials only.

Synthesis of the compound H 2-3:

Synthesis of the compound 12: the synthesis was performed by reference to the synthesis way and treatment method of the compound 09 via changing the corresponding raw materials only.

Synthesis of the compound H 2-3: the synthesis was performed by reference to the synthesis way and treatment method of the compound H 2-1 via changing the corresponding raw materials only.

Synthesis of the Compound H 2-4:

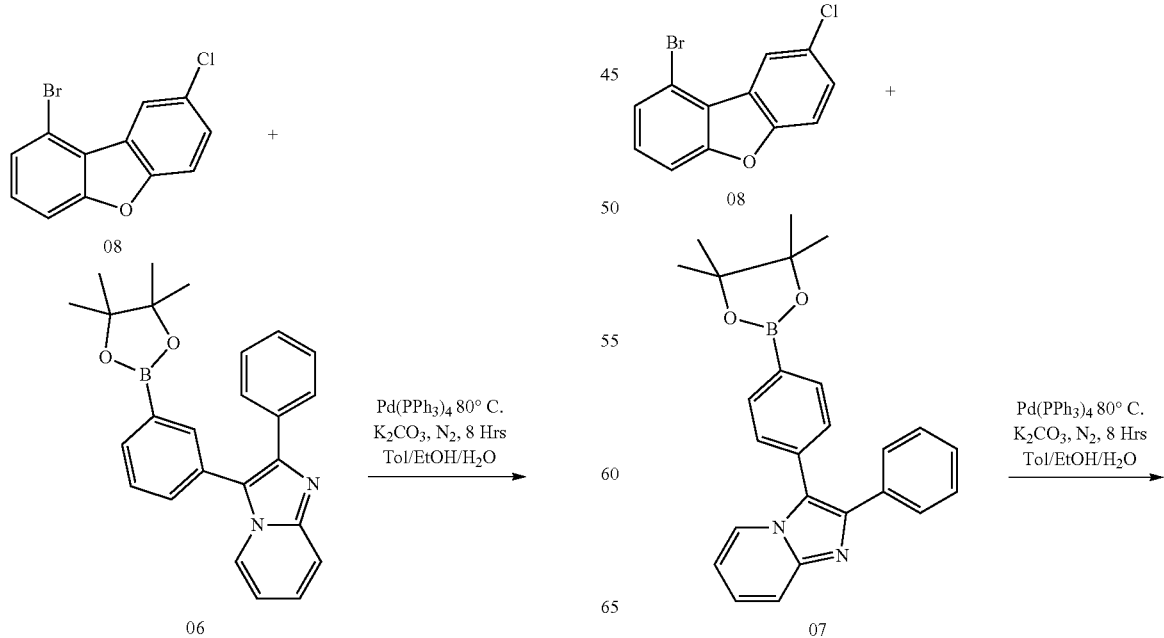

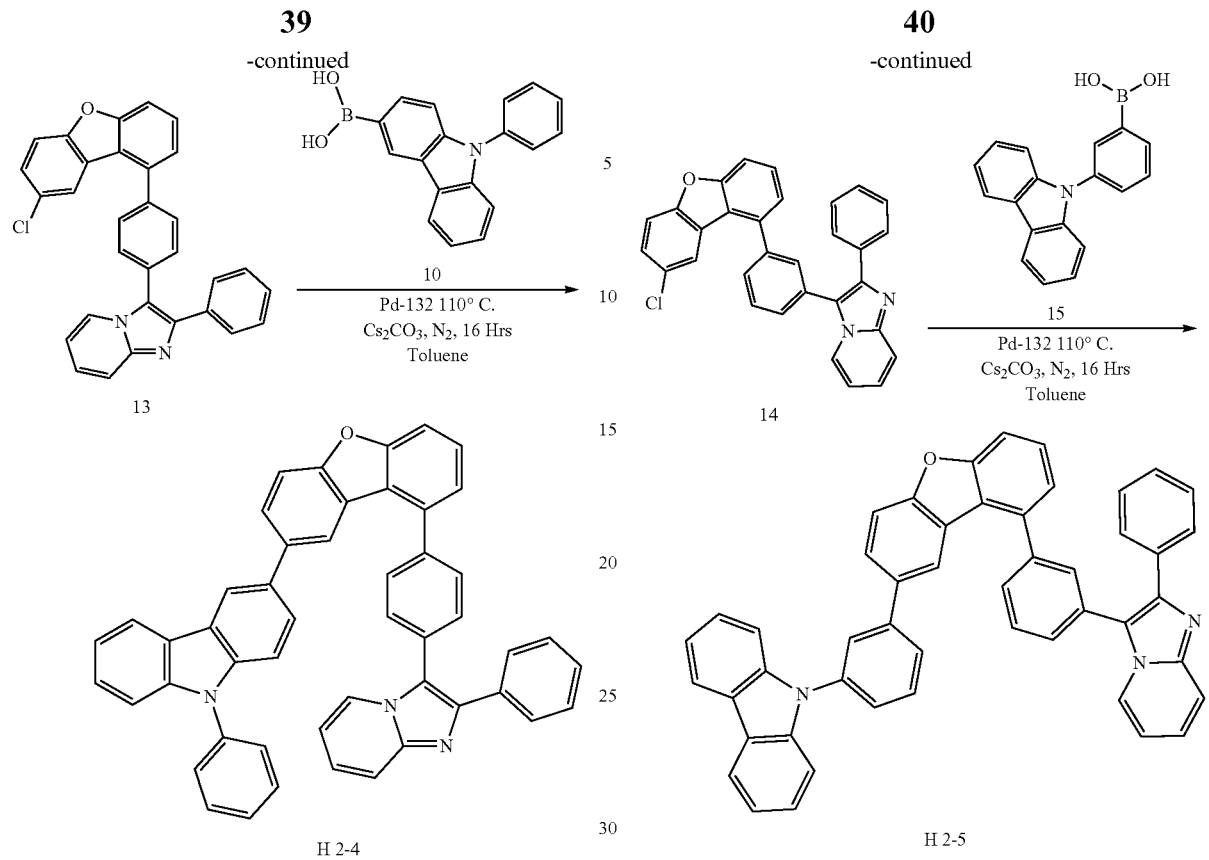

Synthesis of the compound 13: the synthesis was performed by reference to the synthesis way and treatment method of the compound 09 via changing the corresponding raw materials only.

Synthesis of the compound H 2-4: the synthesis was performed by reference to the synthesis way and treatment method of the compound H 2-1 via changing the corresponding raw materials only.

Synthesis of the Compound H 2-5:

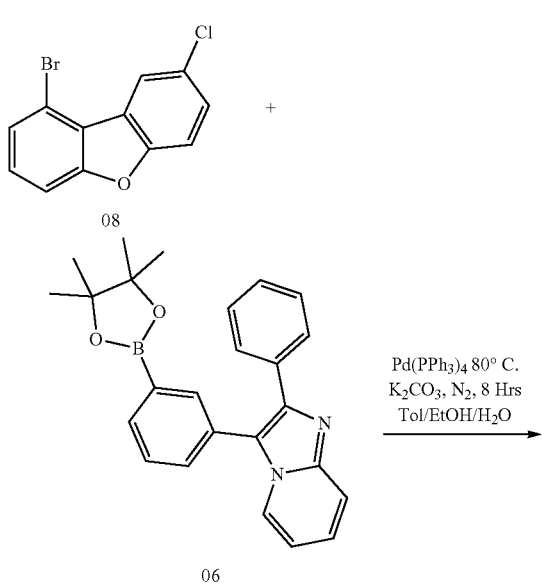

Synthesis of the compound 14: the synthesis was performed by reference to the synthesis way and treatment method of the compound 09 via changing the corresponding raw materials only.

Synthesis of the compound H 2-5: the synthesis was performed by reference to the synthesis way and treatment method of the compound H 2-1 via changing the corresponding raw materials only.

Synthesis of the Compound H 2-32:

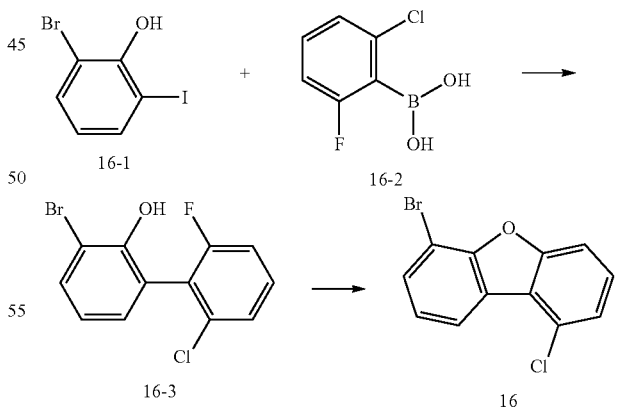

Synthesis of the Compound 16-3:

The compound 16-1 (75 g, 250.92 mmol, 1.0 eq), compound 04 (41.56 g, 238.37 mmol, 0.95 eq), Pd(dppf)Cl$_2$ (9.18 g, 12.55 mmol, 0.05 eq), K$_2$CO$_3$ (69.36 g, 501.83 mmol, 2.0 eq), 1,4-dioxane (450 ml) and H$_2$O (90 ml) were successively added to a 1 L three-necked flask, vacuumized and replaced with nitrogen for 3 times, then heated up to 60-70° C. around in an oil bath and stirred for 4 h; sampling was performed, and completion of the reaction of the raw material 16-2 was monitored by TLC. The reaction system was cooled to room temperature, and added with deionized water (150 ml), then stirred for 0.5 h around and subjected to liquid separation; aqueous phase was extracted by ethyl acetate (150 ml) once, and organic phases were combined and washed with water twice (100 ml/times), subjected to liquid separation and rotary drying. The dried coarse product was subjected to column chromatography isolation (mobile phase was EA:Hex=1:20) and dried to obtain 54.85 g of a compound 16-3 product with a yield of 72.5%. Mass spectrometry: 301.9 (M+H)

Synthesis of the Compound 16:

NaH (content: 60%, 14.54 g, 363.4 mmol, 2.0 eq) and anhydrous DMF (270 ml) dried by GaH were first added to a 2 L three-necked flask, vacuumized and replaced with nitrogen for 3 times, and stirring was started; then anhydrous DMF (530 ml) solution of 16-3 (54.8 g, 181.73 mmol, 1.0 eq) was dropwisely added completely for 20 min, and stirred for 30 min at room temperature; afterwards, the system was heated up to 120° C. and stirred over the night; when the basic completion of the reaction of the raw material 16-3 was monitored by TLC, the system was cooled to room temperature, and added with 200 ml ice water to quench the reaction, and concentrated under reduced pressure at 70° C. to remove DMF, and added with 1 L EA and washed with deionized water (3*600 ml), pH=8; the organic phase was concentrated under reduced pressure to obtain yellowish-brown sticky liquid, then the yellowish-brown sticky liquid was subjected to column chromatography isolation (mobile phase was EA:Hex=1:30) to obtain 33.26 g of a white solid product compound 16 in total with a yield of 65%. Mass spectrometry: 281.5 (M+H)

$^1$H NMR (400 MHz, CDCl$_3$) δ 7.92 (d, 1H), 7.38 (d, 1H), 7.33 (d, 1H), 7.22 (m, 1H), 7.11 (m, J=4.5 Hz, 2H).

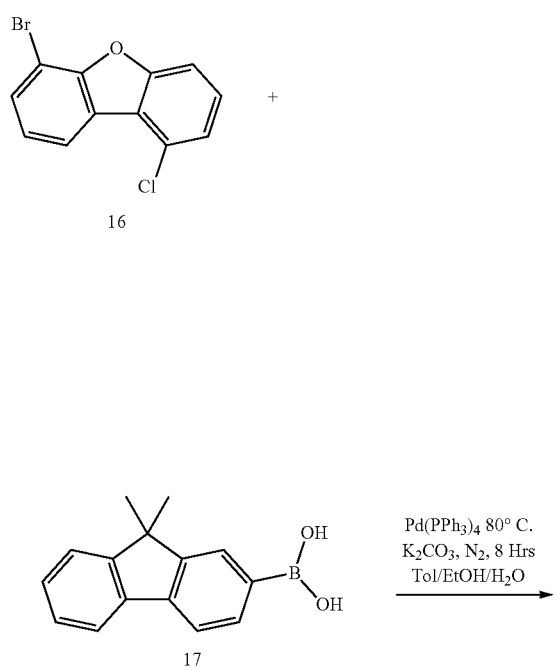

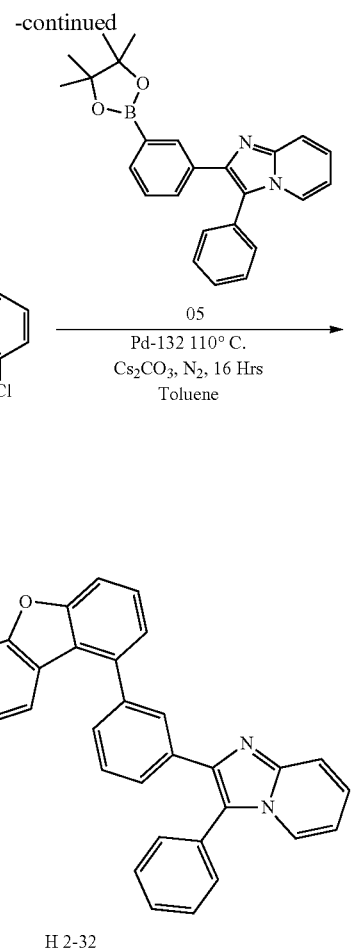

Synthesis of the compound 18: the synthesis was performed by reference to the synthesis way and treatment method of the compound 09 via changing the corresponding raw materials only.

Synthesis of the compound H 2-32: the synthesis was performed by reference to the synthesis way and treatment method of the compound H 2-1 via changing the corresponding raw materials only.

Synthesis of the Compound H 2-45:

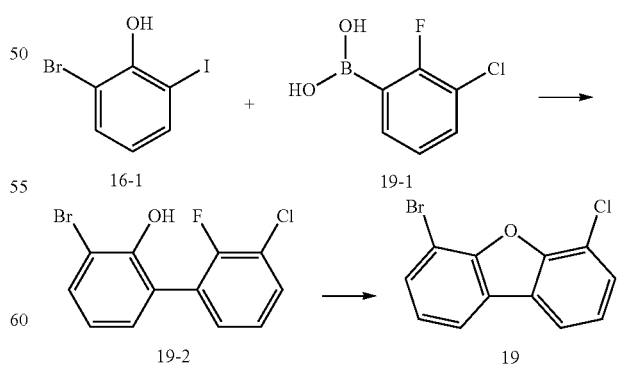

Synthesis of the compound 19-2: the synthesis was performed by reference to the synthesis way and treatment method of the compound 16-3 via changing the corresponding raw materials only.

Synthesis of the compound 19: the synthesis was performed by reference to the synthesis way and treatment method of the compound 16 via changing the corresponding raw materials only.

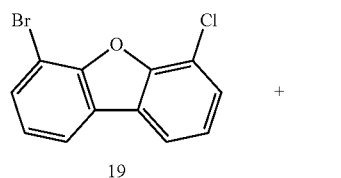

19

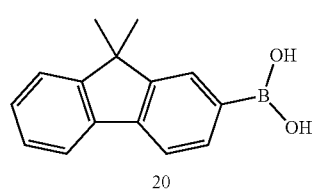 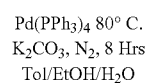 Pd(PPh₃)₄ 80° C.
K₂CO₃, N₂, 8 Hrs
Tol/EtOH/H₂O

20

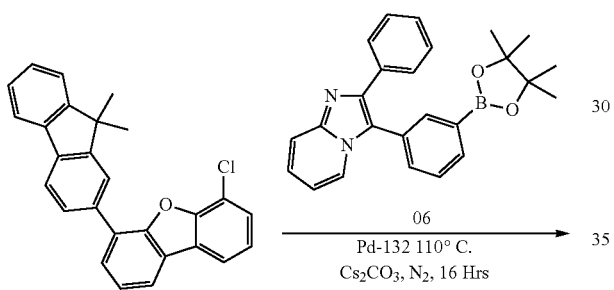

21

06
Pd-132 110° C.
Cs₂CO₃, N₂, 16 Hrs
Toluene

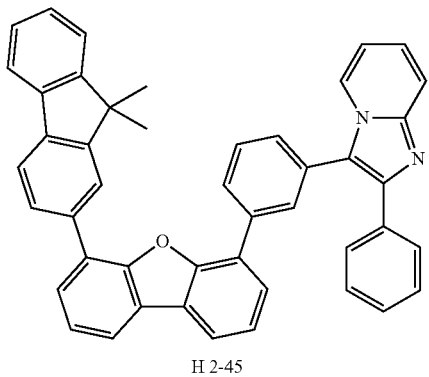

H 2-45

Synthesis of the compound 21: the synthesis was performed by reference to the synthesis way and treatment method of the compound 09 via changing the corresponding raw materials only.

Synthesis of the compound H 2-32: the synthesis was performed by reference to the synthesis way and treatment method of the compound H 2-1 via changing the corresponding raw materials only.

Synthesis of the Compound H 2-49:

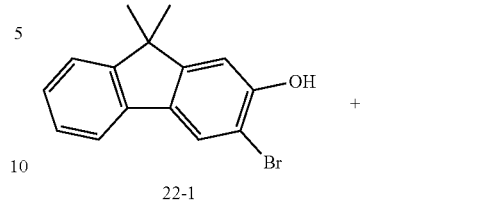

22-1

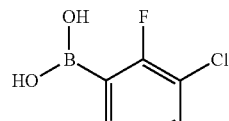

19-1

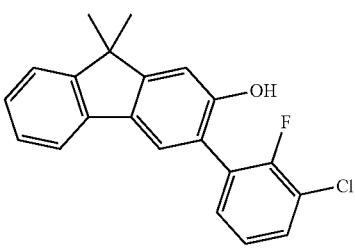

22-2

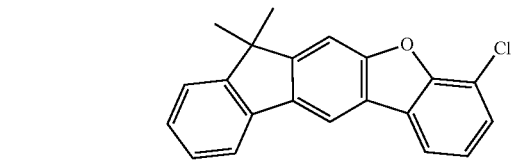

22

Synthesis of the compound 22-2: the synthesis was performed by reference to the synthesis way and treatment method of the compound 16-3 via changing the corresponding raw materials only.

Synthesis of the compound 22: the synthesis was performed by reference to the synthesis way and treatment method of the compound 16 via changing the corresponding raw materials only.

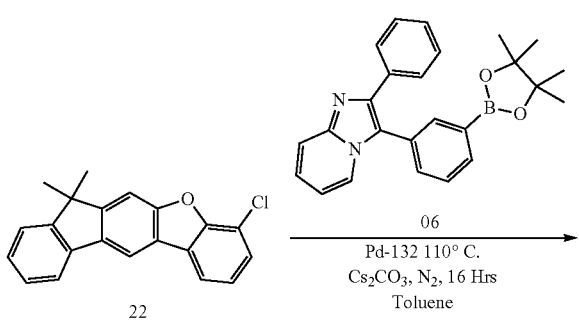

22

Pd-132 110° C.
Cs₂CO₃, N₂, 16 Hrs
Toluene

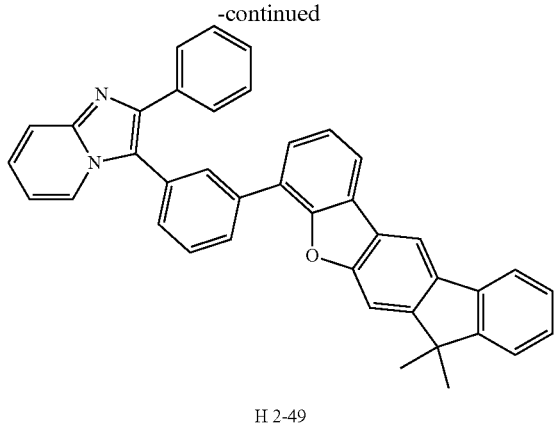

H 2-49

Synthesis of the compound H 2-49: the synthesis was performed by reference to the synthesis way and treatment method of the compound H 2-1 via changing the corresponding raw materials only.

Corresponding raw materials were selected and might be used to synthesize and sublimate to obtain other compounds according to the similar method.

APPLICATION EXAMPLE 1

Production of an organic light-emitting device: 50 mm*50 mm*1.0 mm glass substrate having ITO (100 nm) transparent electrodes was subjected to ultrasonic cleaning for 10 min in ethanol, and dried at 150° C., then treated by N2 Plasma for 30 min. The washed glass substrate was mounted on a substrate support of a vacuum evaporation device; a compound HATCN was evaporated on a face with transparent electrode wires first by covering transparent electrodes to form a thin film having a film thickness of 5 nm; a layer of HTM1 was then evaporated to form a thin film having a film thickness of 60 nm, and a layer of HTM2 was evaporated on the HTM1 film to form a thin film having a film thickness of 10 nm, and then a host material (comparative compound 1 or the compound of the present invention) and a doped compound (doped compound 1 or 2) were evaporated on the HTM2 film in a co-evaporation mode with a film thickness of 30 nm; and a ratio of the host material to the doping material was 90%:10%. A hole blocking layer material (5 nm, the compound of the present invention or free of the layer), an ETL film (25 nm or 30 nm (when there was no hole blocking layer)), and a LiF film (1 nm) were successively evaporated on a light-emitting layer, and finally a layer of metal Al (100 nm) was evaporated as an electrode.

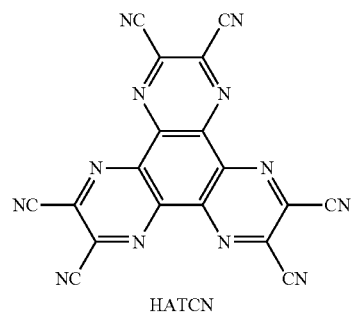

HATCN

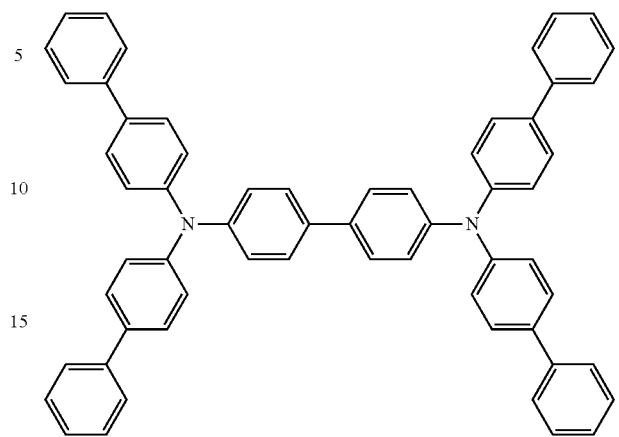

HTM 1

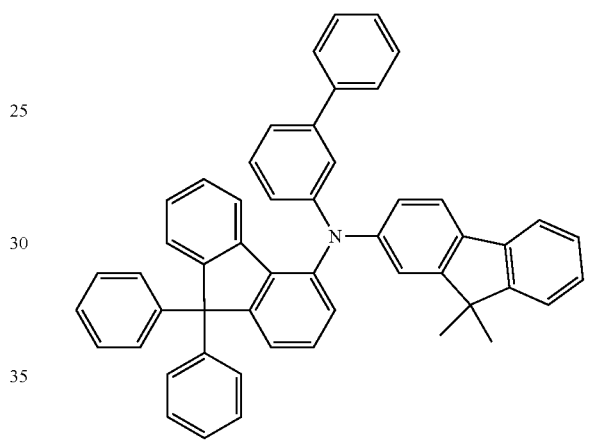

HTM 2

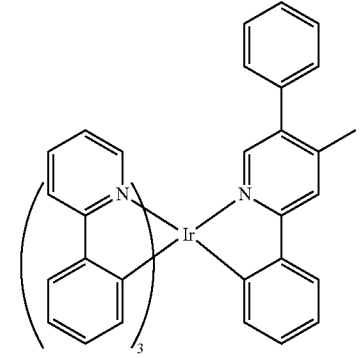

Doping material 1

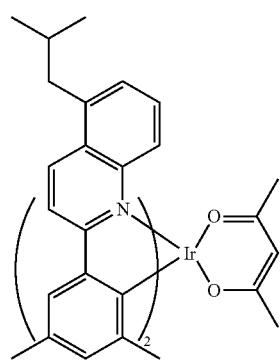

Doping material 2

-continued

Comparative compound 1

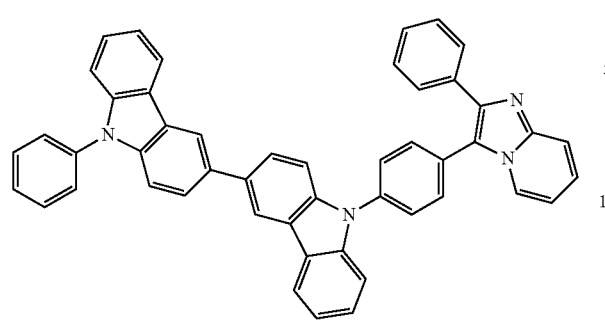

Compound A

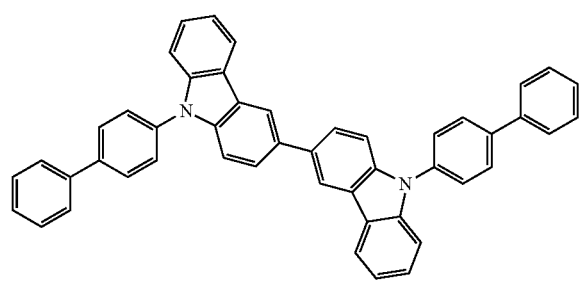

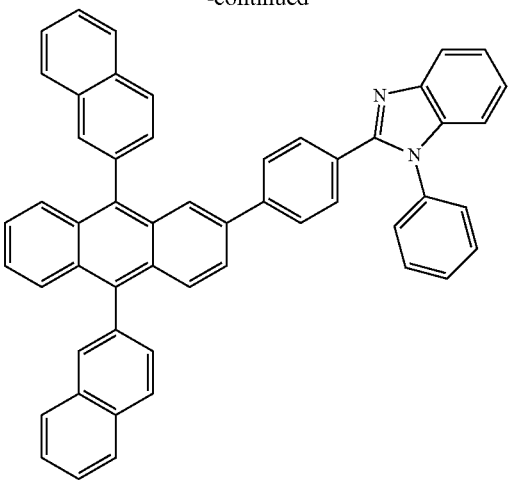

ETL

Evaluation: the above device was subjected to device performance test; in each example and comparative example, a constant current supply (Keithley 2400) was used to flow through a light-emitting element with a constant electric current density; a spectroradiometer (CS 2000) was used to test light emission spectrum. Meanwhile, voltage values and time (LT90) when luminance is 90% of the initial luminance were measured. Results are shown in Table I below:

TABLE I

|  | Host material | Doping material | Hole blocking material | Starting voltage V | Current efficiency Cd/A | Power efficiency 1 m/W | LT90@ 3000nits |
|---|---|---|---|---|---|---|---|
| Example 1 | H 2-1 | Doping material 2 | NA | 4.18 | 22 | 16.53 | 198 |
| Example 2 | H 2-2 |  | NA | 4.22 | 22 | 16.38 | 192 |
| Example 3 | H 2-3 |  | NA | 4.17 | 21 | 15.82 | 208 |
| Example 4 | H 2-4 |  | NA | 4.19 | 22 | 16.50 | 210 |
| Example 5 | H 2-5 |  | NA | 4.20 | 22 | 16.46 | 214 |
| Example 6 | H 2-32 |  | NA | 4.08 | 23 | 17.71 | 241 |
| Example 7 | H 2-32 |  | H 2-45 | 4.10 | 25 | 19.16 | 288 |
| Example 8 | H 2-1 |  | H 2-49 | 4.22 | 24 | 17.87 | 262 |
| Comparative Example 1 | Comparative compound 1 |  | NA | 4.32 | 17 | 12.36 | 83 |
| Comparative Example 2 | Comparative compound 1 |  | Comparative compound 1 | 4.36 | 19 | 13.69 | 86 |
| Comparative Example 3 | Comparative compound 1 |  | H 2-45 | 4.33 | 20 | 14.51 | 116 |
| Example 9 | H 2-1 | Doping material 1 | NA | 4.52 | 61 | 42.40 | 158 |
| Example 10 | H 2-2 |  | NA | 4.51 | 61 | 42.49 | 156 |
| Example 11 | H 2-3 |  | NA | 4.49 | 60 | 41.98 | 162 |
| Example 12 | H 2-4 |  | NA | 4.51 | 62 | 43.19 | 159 |
| Example 13 | H 2-5 |  | NA | 4.53 | 62 | 43.00 | 165 |
| Example 14 | H 2-32 |  | NA | 4.48 | 63 | 44.18 | 176 |
| Example 15 | H 2-32 |  | H 2-45 | 4.51 | 70 | 48.76 | 202 |
| Example 16 | H 2-1 |  | H 2-49 | 4.54 | 65 | 44.98 | 178 |
| Comparative Example 4 | Comparative compound 1 |  | NA | 5.11 | 53 | 32.58 | 95 |
| Comparative Example 5 | Comparative compound 1 |  | Comparative compound 1 | 5.15 | 55 | 33.55 | 98 |
| Comparative Example 6 | Comparative compound 1 |  | H 2-45 | 5.13 | 59 | 36.13 | 116 |

APPLICATION EXAMPLE 2

Production of an organic light-emitting device: 50 mm*50 mm*1.0 mm glass substrate having ITO (100 nm) transparent electrodes was subjected to ultrasonic cleaning for 10 min in ethanol, and dried at 150° C., then treated by N2 Plasma for 30 min. The washed glass substrate was mounted on a substrate support of a vacuum evaporation device; a compound HATCN was evaporated on a face with transparent electrode wires first by covering transparent electrodes to form a thin film having a film thickness of 5 nm; a layer of HTM1 was then evaporated to form a thin film having a film thickness of 60 nm, and a layer of HTM2 was evaporated on the HTM1 film to form a thin film having a film thickness of 10 nm, and then a host material compound A and a host material B (comparative compound 1 or the compound of the present invention) and a doped compound 1 were evaporated on the HTM2 film in a co-evaporation mode with a film thickness of 30 nm; and a ratio of the host material A to the host material B and the doping material was 45%:45%:10%. A hole blocking layer material (5 nm, comparative compound 1 or the compound of the present invention or free of the layer), an ETL film (25 nm or 30 nm (when there was no hole blocking layer)), and a LiF film (1 nm) were successively evaporated on a light-emitting layer, and finally a layer of metal Al (100 nm) was evaporated as an electrode.

Evaluation: the above device was subjected to device performance test; in each example and comparative example, a constant current supply (Keithley 2400) was used to flow through a light-emitting element with a constant electric current density; a spectroradiometer (CS 2000) was used to test light emission spectrum. Meanwhile, voltage values and time (LT90) when luminance is 90% of the initial luminance were measured. Results are shown in Table II below:

TABLE II

| | Host material B | Hole blocking material | Starting voltage V | Current efficiency Cd/A | Power efficiency 1 m/W | LT90@ 3000nits |
|---|---|---|---|---|---|---|
| Example 17 | H 2-1 | NA | 4.36 | 64.5 | 46.48 | 182 |
| Example 18 | H 2-32 | NA | 4.32 | 66.8 | 48.58 | 196 |
| Example 19 | H 2-32 | H 2-45 | 4.35 | 77.3 | 55.83 | 284 |
| Example 20 | H 2-1 | H 2-49 | 4.39 | 67.2 | 48.09 | 243 |
| Comparative Example 7 | Comparative compound 1 | NA | 4.78 | 56.9 | 37.40 | 106 |
| Comparative Example 8 | Comparative compound 1 | Comparative compound 1 | 4.83 | 59.8 | 38.90 | 112 |
| Comparative Example 9 | Comparative compound 1 | H 2-45 | 4.82 | 61.3 | 39.95 | 138 |

It can be seen from data of the above Table I and Table II that whatever the compound of the present invention is independently used as a host material, a mixed host material, hole blocking layer material or both used as a host material and a hole blocking layer material of a light-emitting layer, compared with other comparative compounds, the organic light-emitting device with the compound of the present invention as a dopant shows more superior performances in driving voltage, luminous efficiency and device service life. Therefore, the compound of the present invention has the possibility of being applied to the AMOI ED industry.

The above results indicate that the compound of the present invention has the advantages of high photo-stability and electrical stability, high luminous efficiency, long service life of device, and thus, can be applied to an organic light emitting device, particularly as a luminous host material and/or hole blocking layer material, and has the possibility of being applied to the AMOI ED industry.

The invention claimed is:

1. A dibenzoheterocycle organic compound comprising imidazo[1,2-a] pyridine, wherein the organic compound has a structure as shown in Formula 1:

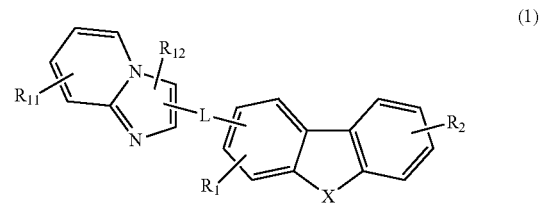

(1)

wherein:

X is selected from the group consisting of: O, S, Se and $BR_9$;

$R_1$, $R_2$, and $R_{11}$ are zero substitution to a maximum possible number of substitutions and, in case of poly-substitution, two adjacent substitutions are capable of being linked with each other to form a fused ring structure with Formula 1;

$R_1$, at each occurrence, is independently selected from hydrogen, deuterium, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl;

$R_2$ and $R_9$ at each occurrence, are independently selected from substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl;

$R_{11}$, at each occurrence, is independently selected from hydrogen, deuterium, halogen, substituted or unsubstituted C1-C10 alkyl, substituted or unsubstituted C1-C10 heteroalkyl, substituted or unsubstituted C6-C30 aralkyl, substituted or unsubstituted C1-C10 alkoxy, substituted or unsubstituted C6-C30 aryloxy, amino, substituted or unsubstituted C3-C30 silicyl, substituted or unsubstituted C6-C30 aryl, and substituted or unsubstituted C1-C30 heteroaryl, cyano, or isocyano;

R$_{12}$ is independently selected from substituted or unsubstituted C6-C30 aryl, substituted or unsubstituted C1-C30 heteroaryl;

L, at each occurrence, is independently selected from substituted or unsubstituted C1-C10 alkylene, substituted or unsubstituted C1-C10 heteroalkylene, substituted or unsubstituted C6-C30 aralkylene, substituted or unsubstituted C1-C10 alkoxylene, substituted or unsubstituted C6-C30 aryloxylene, imino, substituted or unsubstituted C3-C30 silicylene, substituted or unsubstituted C6-C30 arylene, and substituted or unsubstituted C2-C30 heteroarylene;

wherein the substitution is independently selected from substitution by deuterium, halogen, C1-C4 alkyl, C1-C4 alkoxy, C3-C6 cycloalkyl, C6-C18 aryl, C1-C18 heteroaryl, amido substituted by C1-C4 alkyl or amido substituted by C6-C18 aryl.

2. The compound according to claim 1, selected from any one of the following Formulas 2-9:

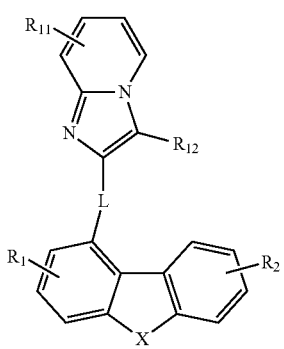

(2)

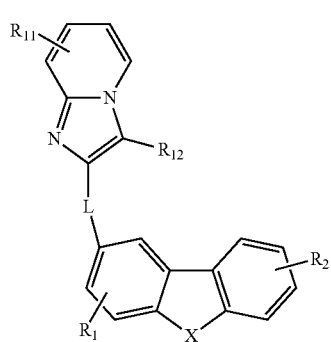

(3)

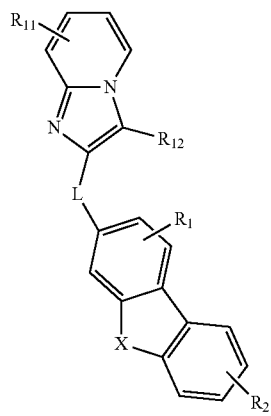

(4)

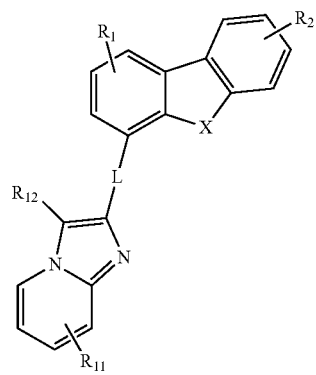

(5)

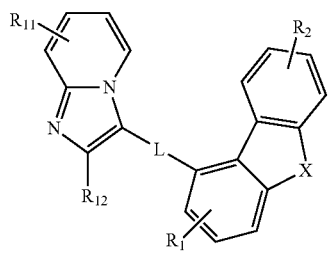

(6)

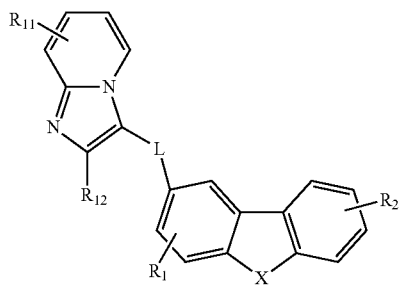

(7)

-continued

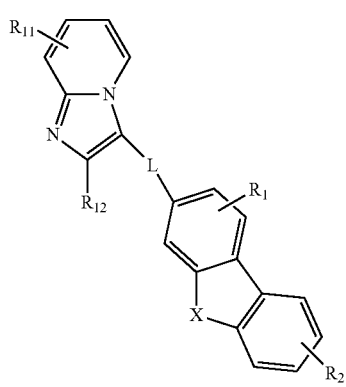
(8)

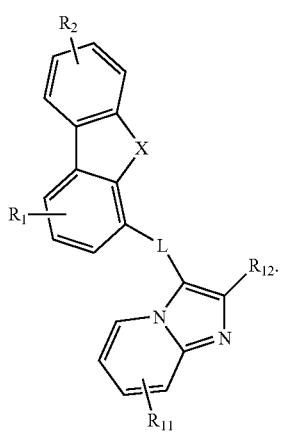
(9)

3. The compound according to claim 2, wherein:
$R_1$ is hydrogen;
$R_2$ is mono-substitution or adjacent di-substitution;
the mono-substitution is substituted or unsubstituted C6-C20 aryl, or substituted or unsubstituted C1-C20 heteroaryl;
the di-substitution is independently selected from substituted or unsubstituted C1-C8 alkyl, substituted or unsubstituted C2-C8 alkenyl, substituted or unsubstituted C6-C10 aryl, or substituted or unsubstituted C1-C10 heteroaryl;
$R_{11}$ is hydrogen or mono-substitution or adjacent di-substitution;
the mono-substitution is substituted or unsubstituted C6-C20 aryl, or substituted or unsubstituted C1-C20 heteroaryl;
the di-substitution is independently selected from substituted or unsubstituted C1-C8 alkyl, substituted or unsubstituted C2-C8 alkenyl, substituted or unsubstituted C6-C10 aryl, or substituted or unsubstituted C1-C10 heteroaryl; and
$R_{12}$ is C6-C10 aryl or C1-C10 heteroaryl.

4. The compound according to claim 3, wherein:
the heteroaryl in $R_1$, $R_2$, $R_9$, $R_{11}$ and $R_{12}$ is a nitrogen-containing heteroaryl;
X is selected from the group consisting of: O, S, and $BR_9$;
$R_9$ independently represent H, substituted or unsubstituted C1-C8 alkyl, substituted or unsubstituted C3-C8 cycloalkyl, substituted or unsubstituted C1-C8 heteroalkyl, substituted or unsubstituted C6-C10 aralkyl, or substituted or unsubstituted C6-C10 aryl.

5. The compound according to claim 4, wherein $R_9$ independently represent C1-C4 alkyl or C6-C10 aryl.

6. The compound according to claim 2:
wherein:
L is represented by any one of the following Formulas 11-26; and
wherein:
Ra-Rr each independently represents hydrogen, deuterium, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, or substituted or unsubstituted C1-C30 heteroaryl; and
the substitution refers to a substitution by deuterium, halogen, C1-C4 alkyl, C1-C4 alkoxy, C3-C6 cycloalkyl, C6-C18 aryl, C1-C18 heteroaryl, amido substituted by C1-C4 alkyl, or amido substituted by C6-C18 aryl; or
wherein:
$R_a$-$R_r$ are capable of being bound with each other to form a fused ring structure,

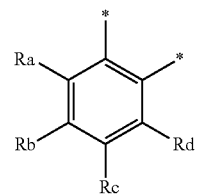
(11)

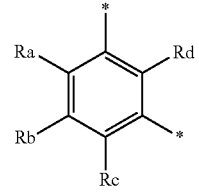
(12)

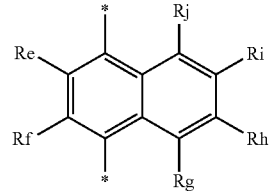
(13)

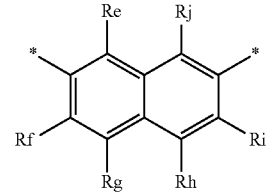
(14)

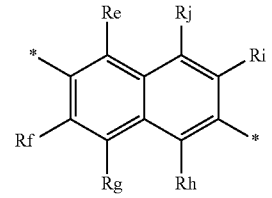
(15)

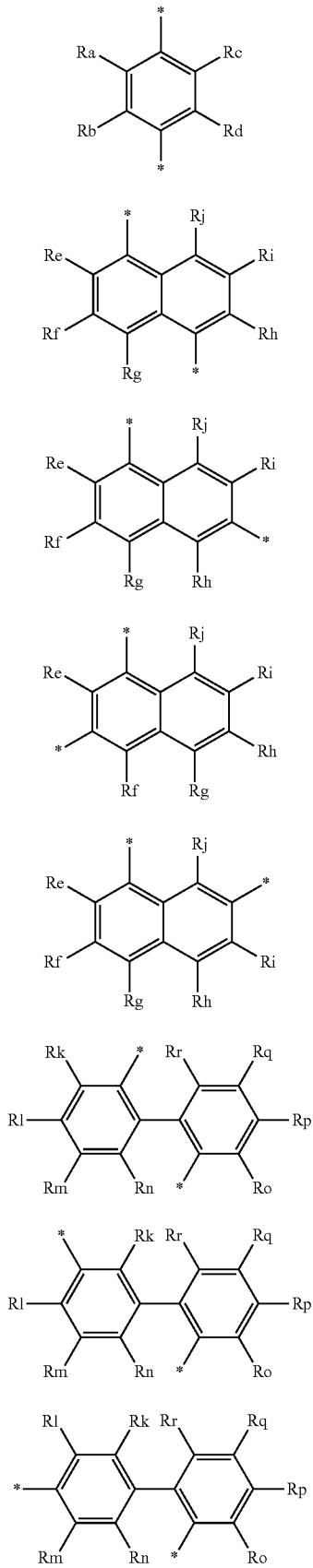

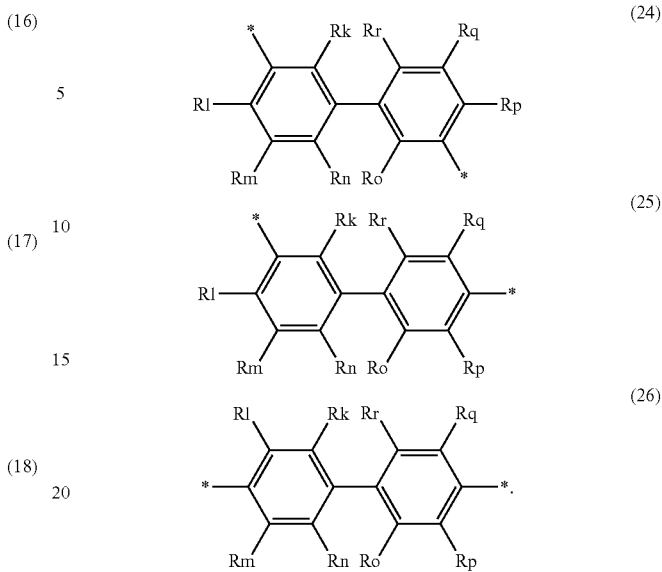

7. The compound according to claim 6, wherein Ra-Rr each independently represents hydrogen, C1-C8 alkyl or C6-C10 aryl.

8. The compound according to claim 7, wherein Ra-Rr each independently represents hydrogen, phenyl or naphthyl.

9. The compound according to claim 8, wherein:
$R_{11}$ is hydrogen; and
$R_{12}$ is phenyl, biphenyl or naphthyl.

10. A dibenzoheterocycle organic compound comprising imidazo[1,2-a] pyridine, wherein:
the organic compound has a structure as shown in Formula 1:

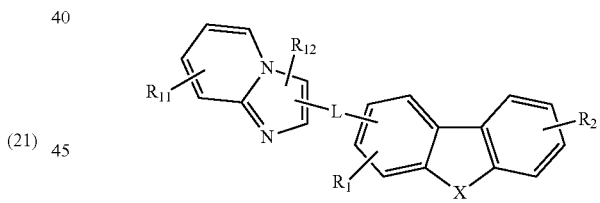

wherein:
X is selected from the group consisting of: O, S, Se and $BR_9$;
$R_1$, $R_{11}$ are zero substitution to a maximum possible number of substitutions and, in case of polysubstitution, two adjacent substitutions are capable of being linked with each other to form a fused ring structure with Formula 1;
$R_1$ at each occurrence, is independently selected from hydrogen, deuterium, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl;
$R_9$ at each occurrence, are independently selected from substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, and substituted or unsubstituted C1-C30 heteroaryl;

$R_{11}$ at each occurrence, is independently selected from hydrogen, deuterium, halogen, substituted or unsubstituted C1-C10 alkyl, substituted or unsubstituted C1-C10 heteroalkyl, substituted or unsubstituted C6-C30 aralkyl, substituted or unsubstituted C1-C10 alkoxy, substituted or unsubstituted C6-C30 aryloxy, amino, substituted or unsubstituted C3-C30 silicyl, substituted or unsubstituted C6-C30 aryl, and substituted or unsubstituted C1-C30 heteroaryl, cyano, or isocyano;

$R_{12}$ is independently selected from substituted or unsubstituted C6-C30 aryl, substituted or unsubstituted C1-C30 heteroaryl;

L, at each occurrence, is independently selected from substituted or unsubstituted C1-C10 alkylene, substituted or unsubstituted C1-C10 heteroalkylene, substituted or unsubstituted C6-C30 aralkylene, substituted or unsubstituted C1-C10 alkoxylene, substituted or unsubstituted C6-C30 aryloxylene, imino, substituted or unsubstituted C3-C30 silicylene, substituted or unsubstituted C6-C30 arylene, and substituted or unsubstituted C2-C30 heteroarylene;

the substitution refers to a substitution by deuterium, halogen, C1-C4 alkyl, C1-C4 alkoxy, C3-C6 cycloalkyl, C6-C18 aryl, C1-C18 heteroaryl, amido substituted by C1-C4 alkyl or amido substituted by C6-C18 aryl;

$R_2$ is Formula 27:

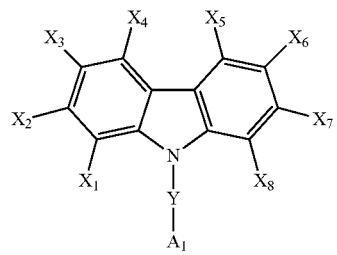

(27)

wherein:

$A_1$ represents substituted or unsubstituted C6-C30 aryl, substituted or unsubstituted C1-C30 heteroaryl;

Y represents a single bond or substituted or unsubstituted C6-C30 arylene; and

Formula (27) is not substituted but bonded on Formula 1 directly via at least one of the $X_1$-$X_8$ or bonded on Formula 1 via a group $A_1$; and wherein:

$X_1$-$X_8$ each independently represents hydrogen, deuterium, halogen, cyano, carboxyl, nitryl, substituted or unsubstituted C1-C30 alkyl, substituted or unsubstituted C2-C30 alkenyl, substituted or unsubstituted C2-C30 alkynyl, substituted or unsubstituted C3-C30 cycloalkyl, substituted or unsubstituted C1-C10 heteroalkyl, substituted or unsubstituted C6-C30 aralkyl, substituted or unsubstituted C6-C30 aryl, or substituted or unsubstituted C1-C30 heteroaryl,; and the substitution in Formula 27 refers to a substitution by deuterium, halogen, C1-C4 alkyl, C1-C4 alkoxy, C3-C6 cycloalkyl, C6-C18 aryl, C1-C18 heteroaryl, amido substituted by C1-C4 alkyl, or amido substituted by C6-C18 aryl; or wherein:

$X_1$-$X_8$ are linked with each other in adjacent position to form a cyclic structure and to form a fused ring with Formula 27.

11. The compound according to claim 10, wherein:

the $X_1$-$X_8$ represent hydrogen; and at least one of the $X_1$-$X_8$ is not substituted but bonded on Formula 1.

12. The compound according to claim 11, wherein:

$A_1$ represents C6-C10 aryl and C1-C10 heteroaryl; and

Y represents a single bond or C6-C10 arylene.

13. The compound according to claim 12, wherein:

$A_1$ represents phenyl; and

Y represents a single bond.

14. A dibenzoheterocycle organic compound comprising imidazo[1,2-a] pyridine, which is one of the following compounds:

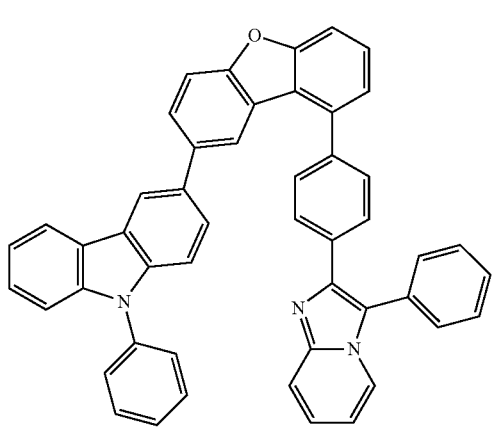

H2-1

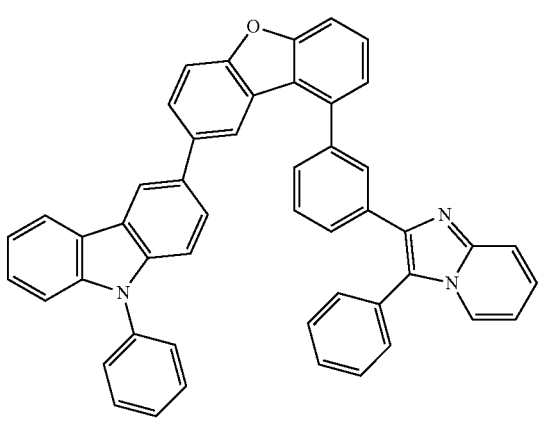

H2-2

H2-3
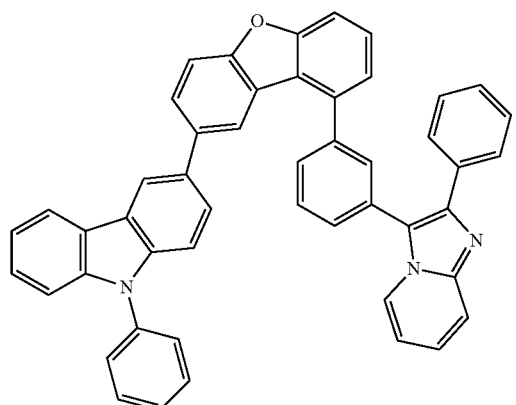
H2-4
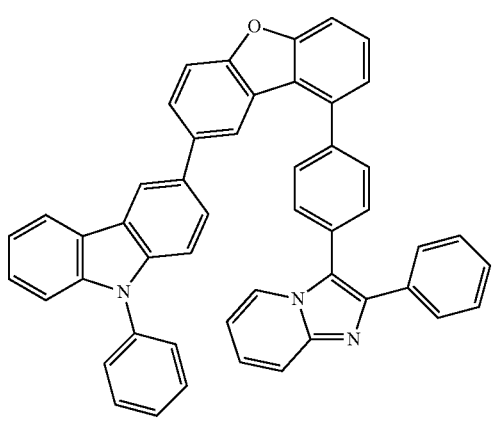
H2-5
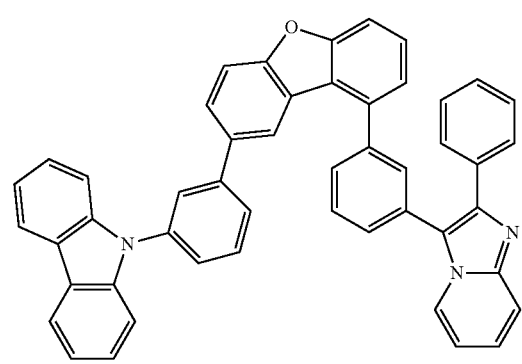
H2-6
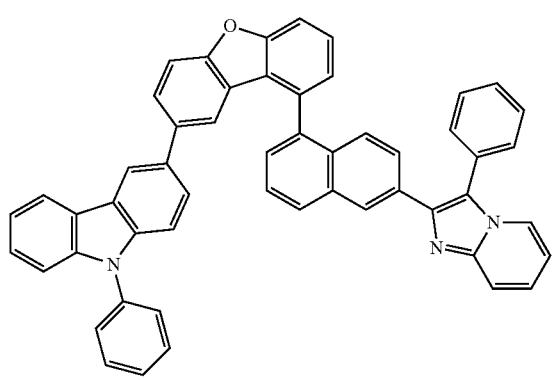
H2-7
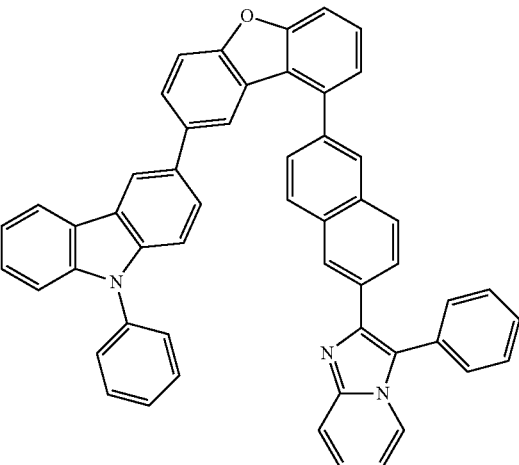
H2-8
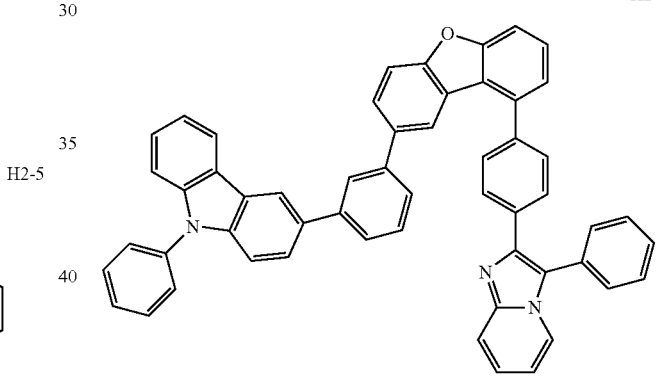
H2-9
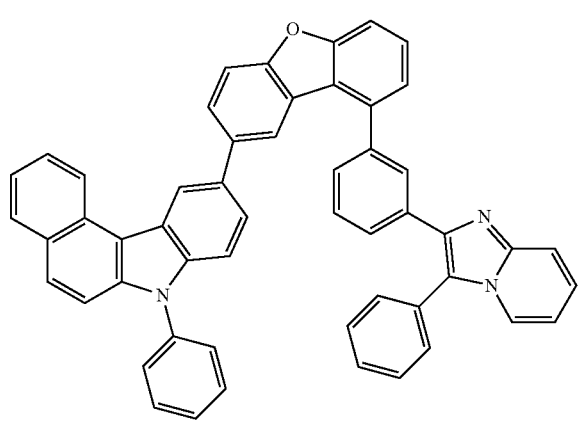

H2-10
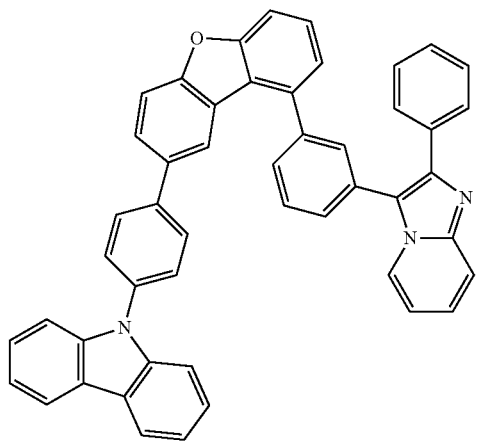
H2-11
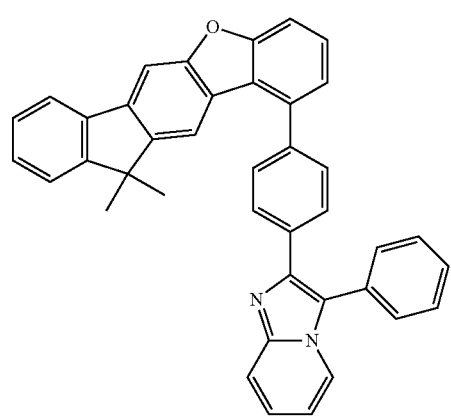
H2-12
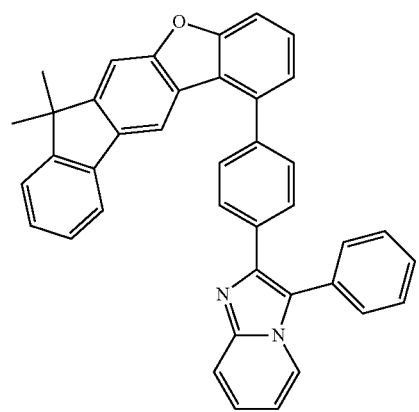
H2-13
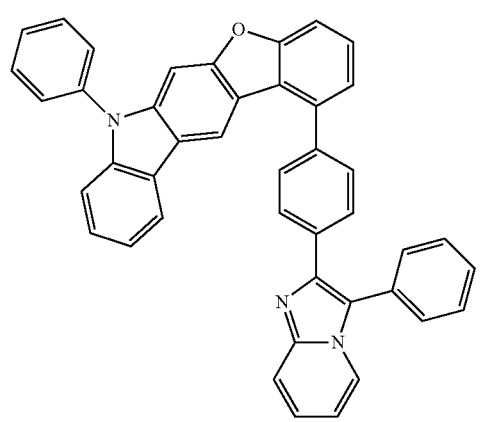
H2-14
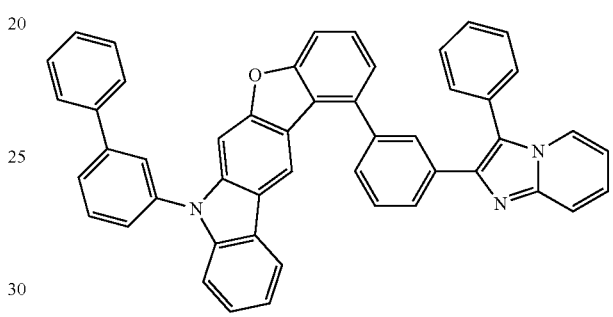
H2-15
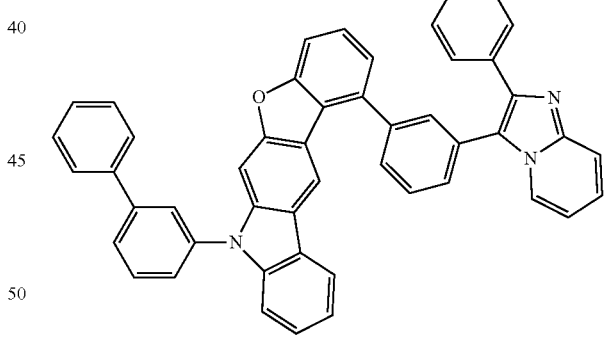
H2-16
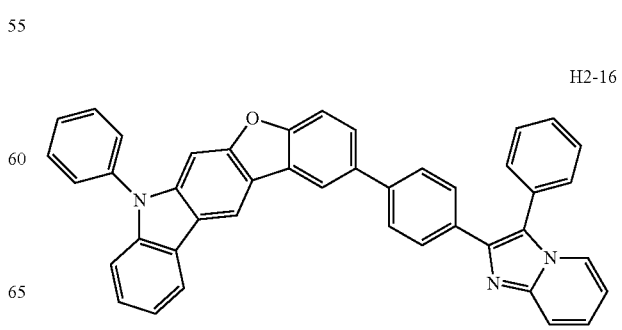

-continued
H2-17
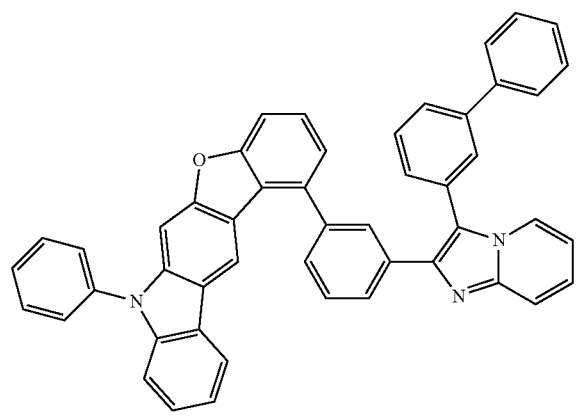
H2-18
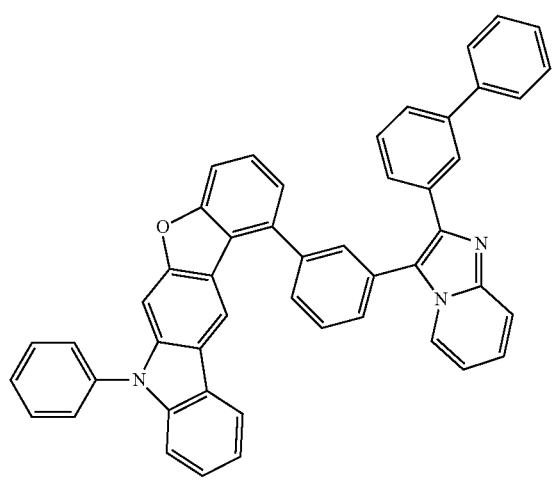
H2-19
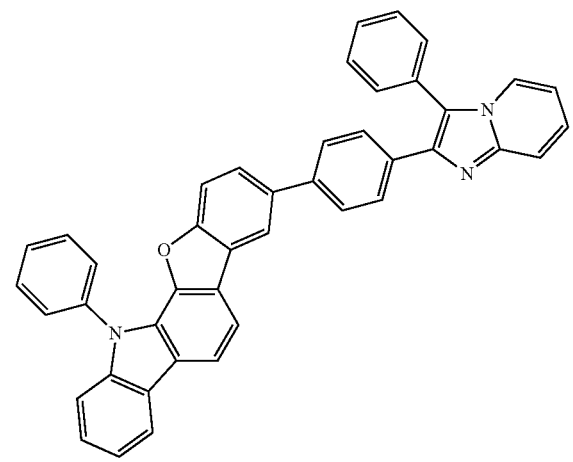
H2-20
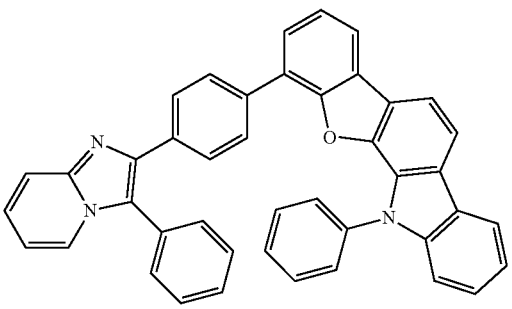
H2-21
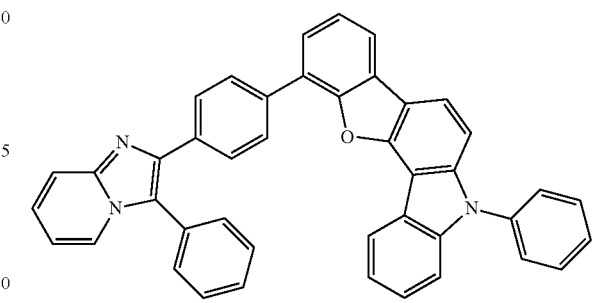
H2-22
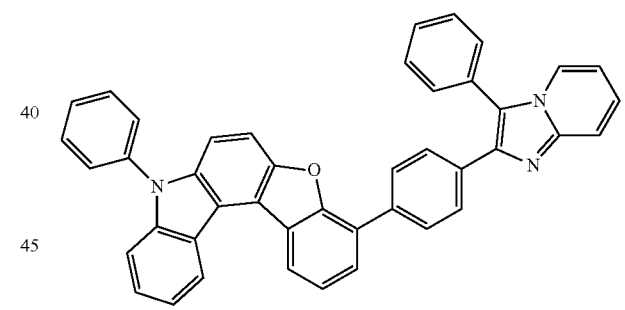
H2-23
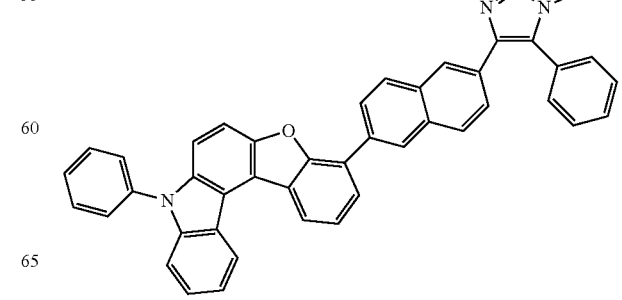

H2-24
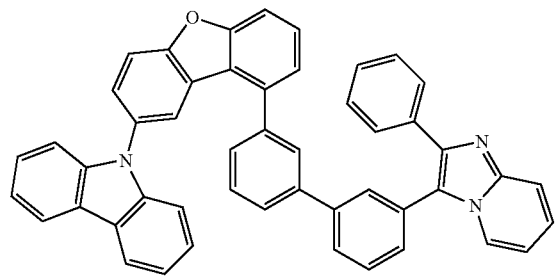
H2-27
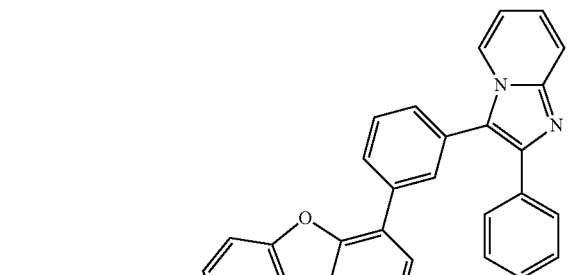
H2-25
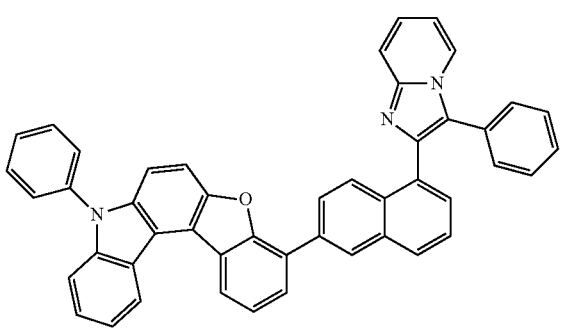
H2-26
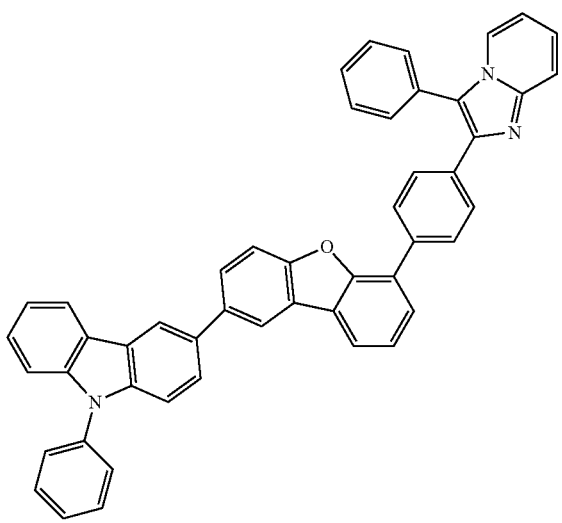
H2-28
H2-29
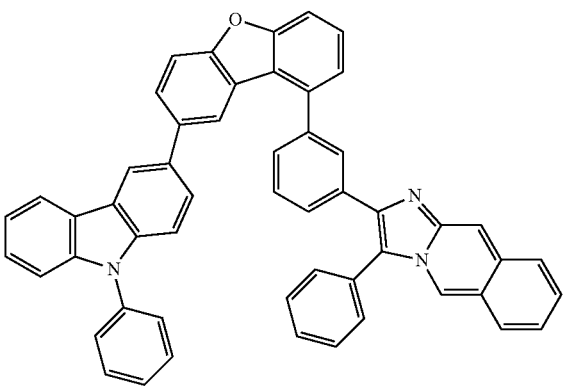

-continued
H2-30
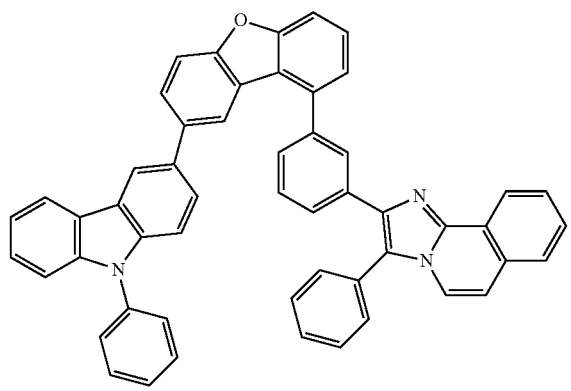
H2-31
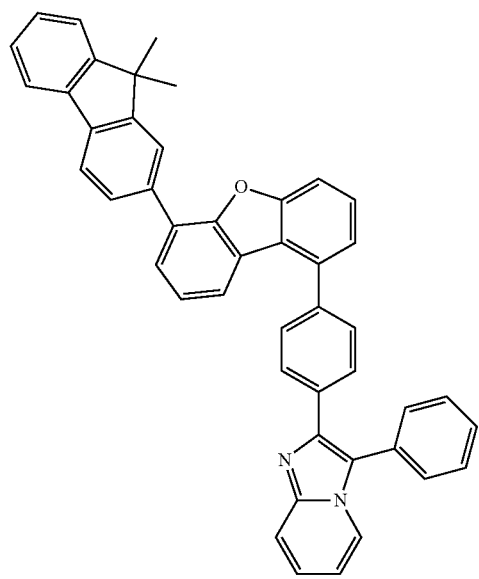
H2-32
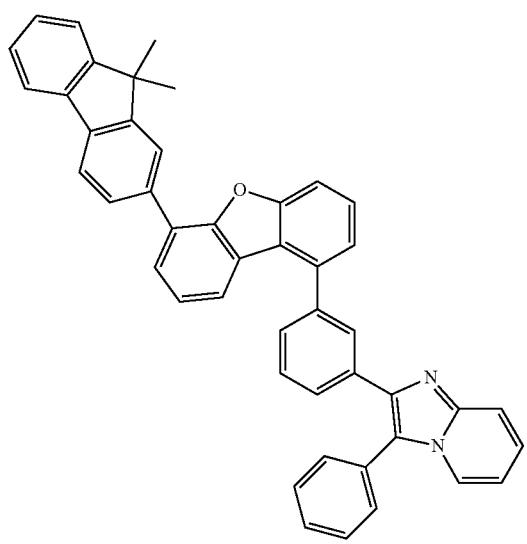
-continued
H2-33
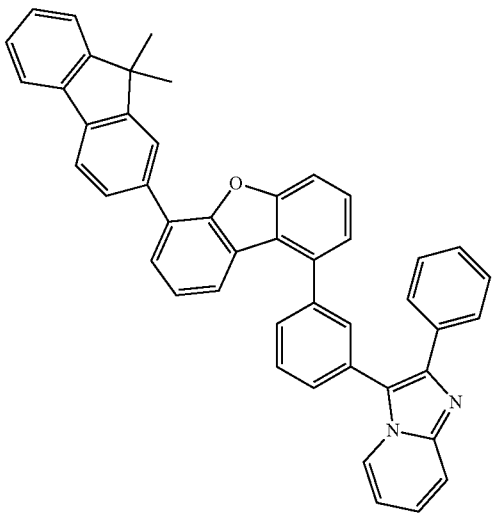
H2-34
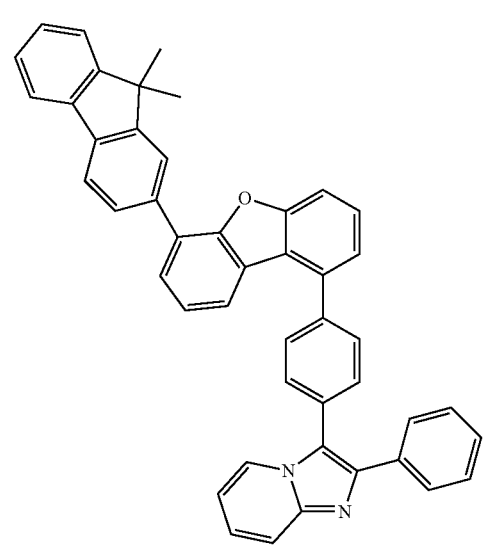
H2-35
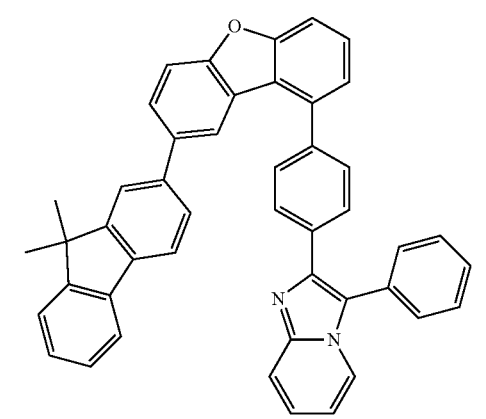

H2-36
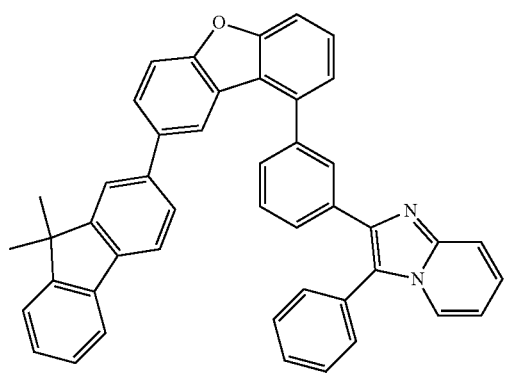
H2-40
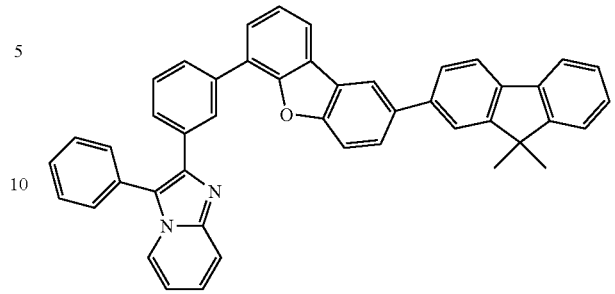
H2-37
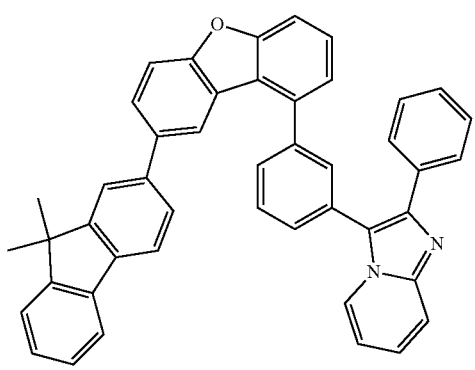
H2-41
H2-38
H2-42
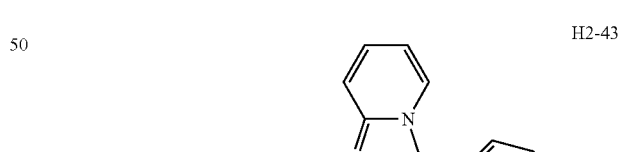
H2-39
H2-43
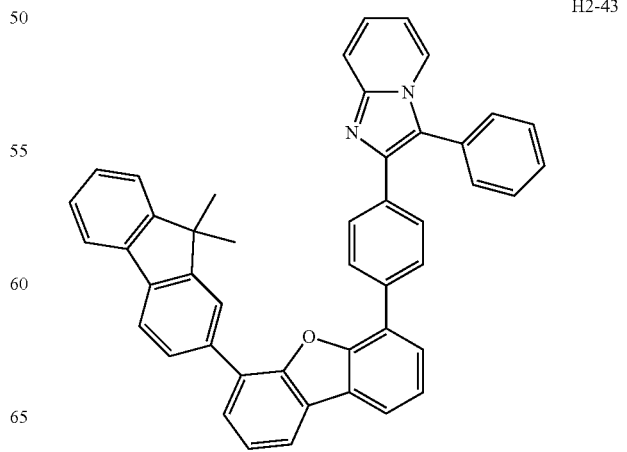

H2-44
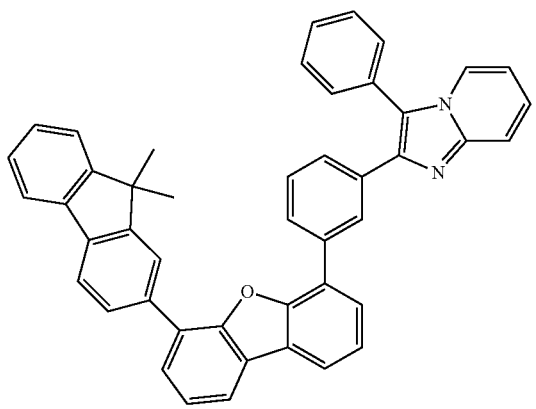
H2-45
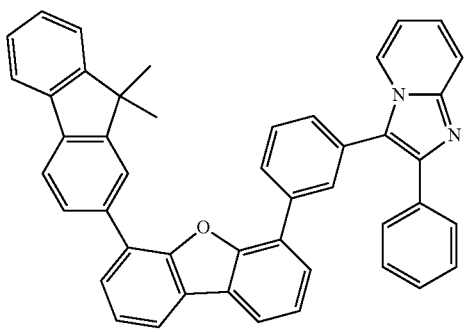
H2-46
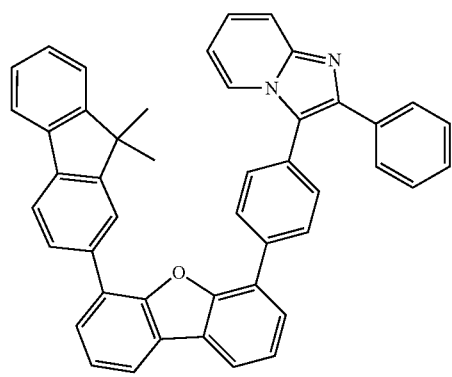
H2-47
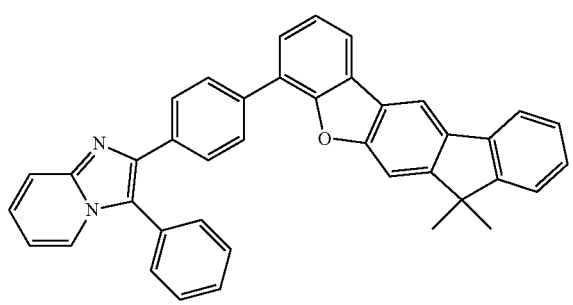
H2-48
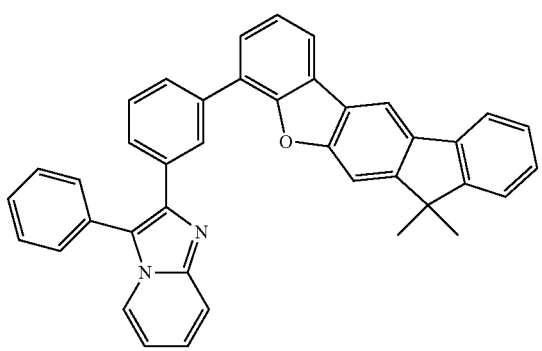
H2-49
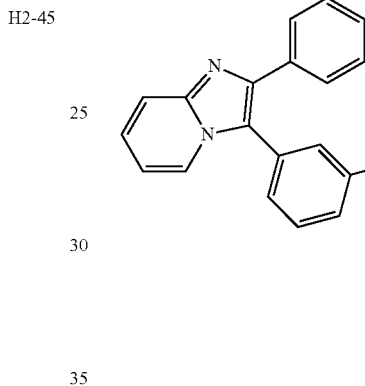
H2-50
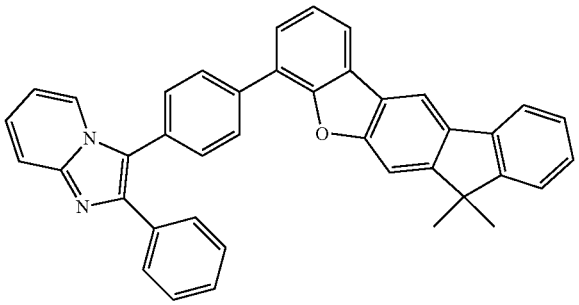
H2-51
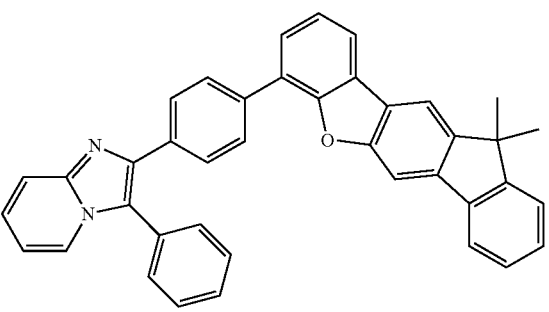

H2-52
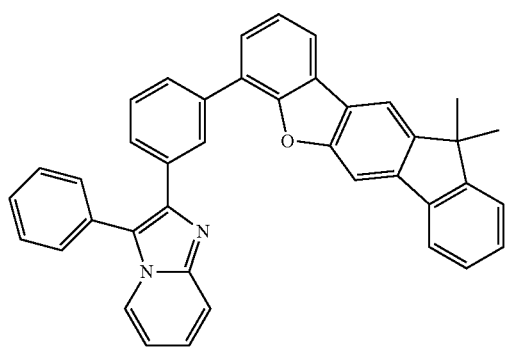
H2-53
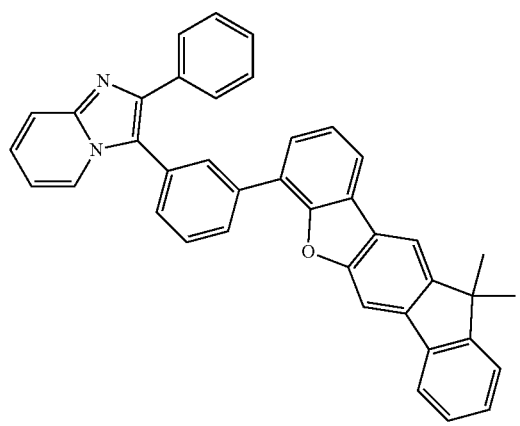
H2-54
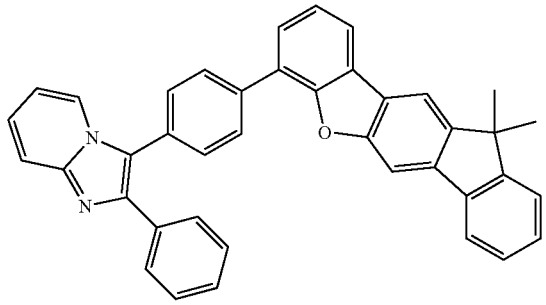
H2-55
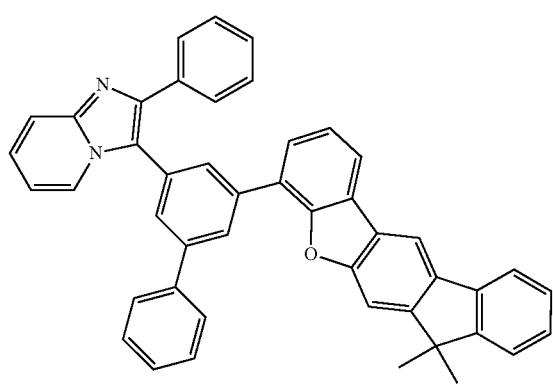
H2-56
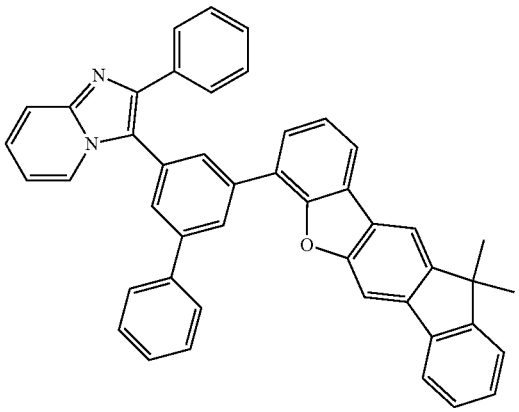
H2-57
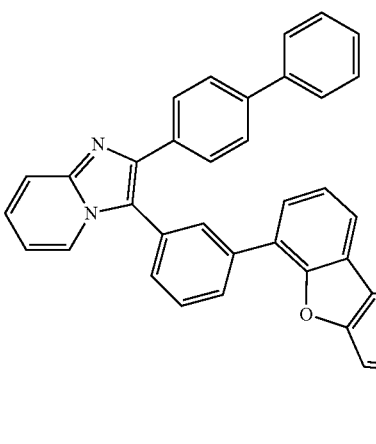
H2-58
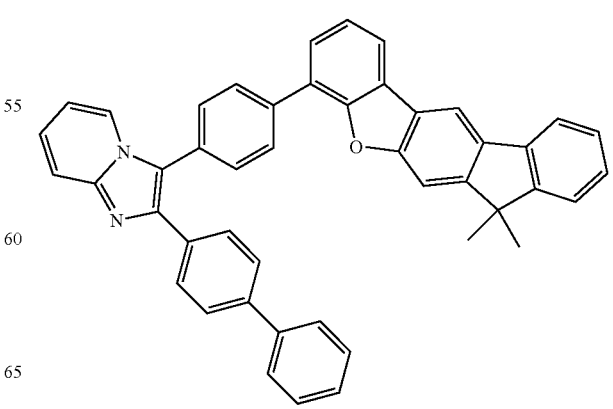

H2-59
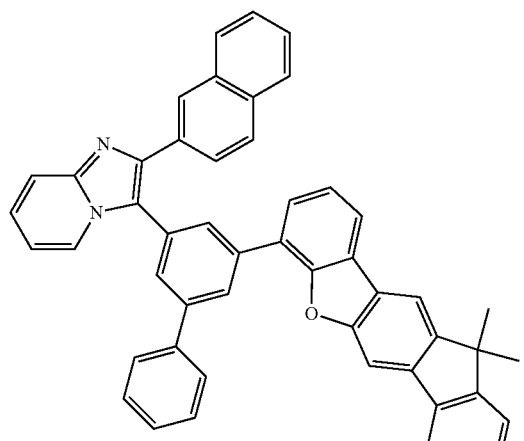
H2-60
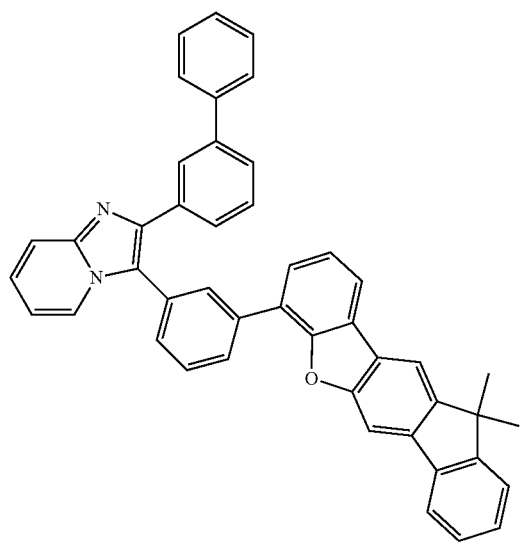
H2-61
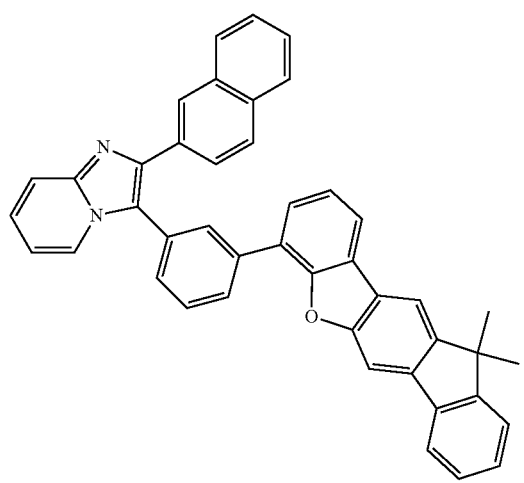
H2-62
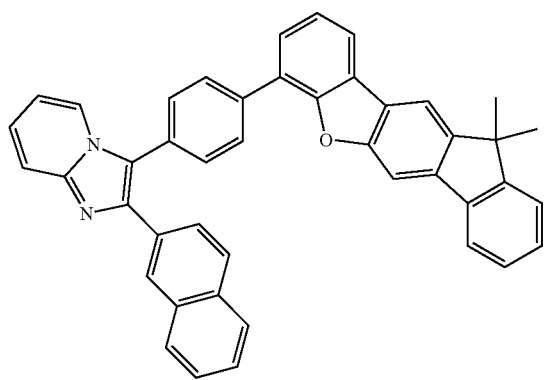
H2-63
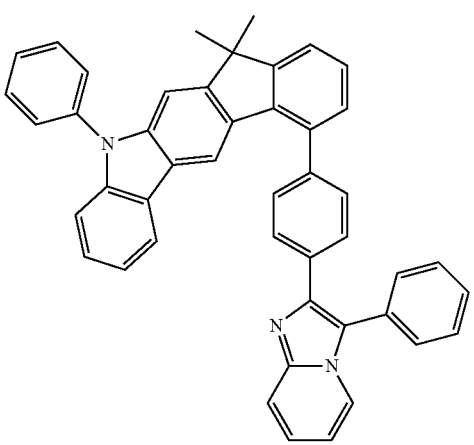
H2-64
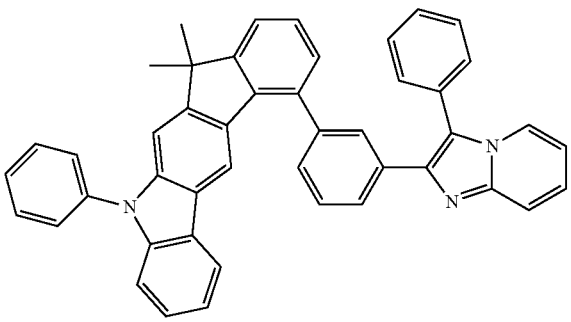
H2-65
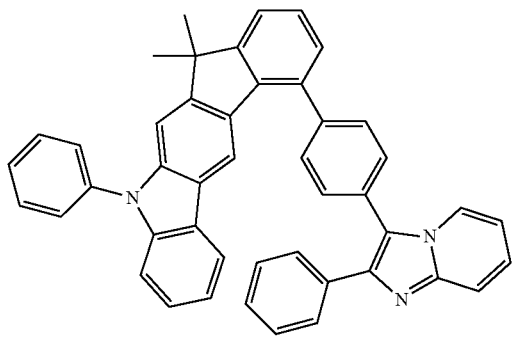

H2-66
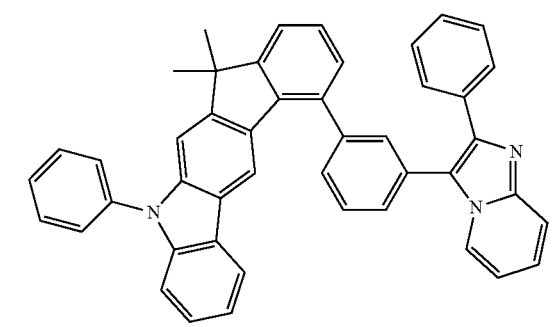
H2-67
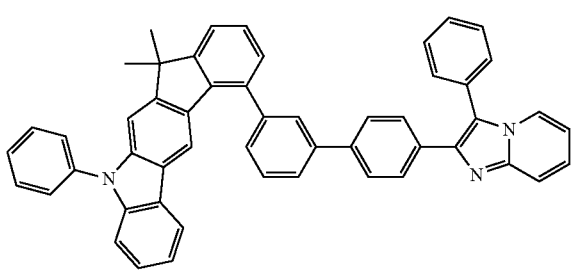
H2-68
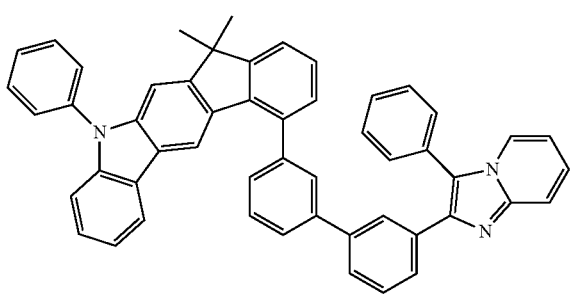
H2-69
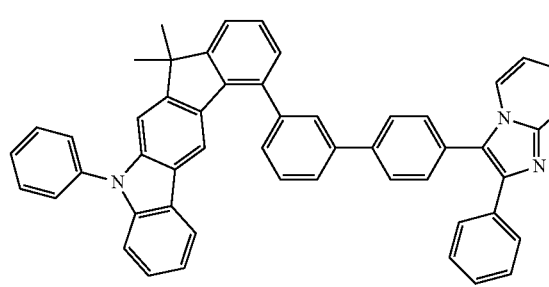
H2-70
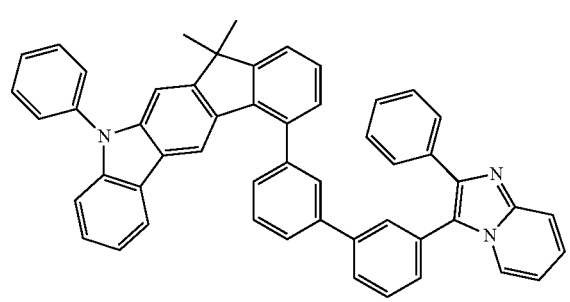
H2-71
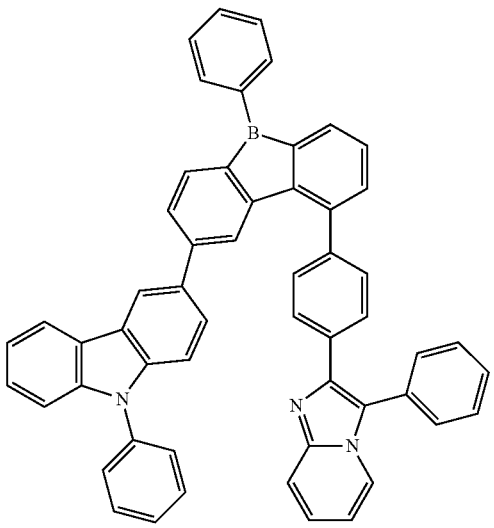
H2-72
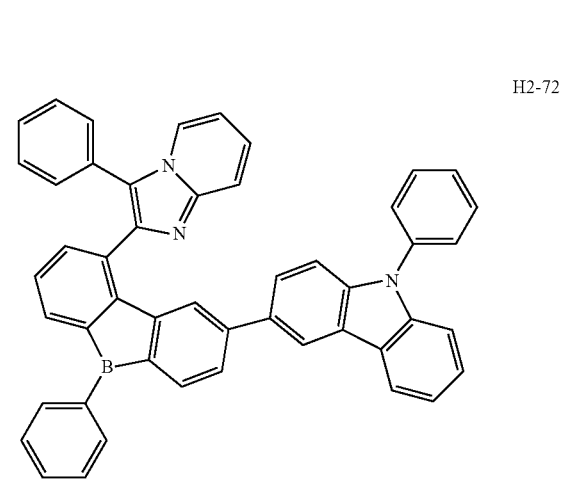
H2-73
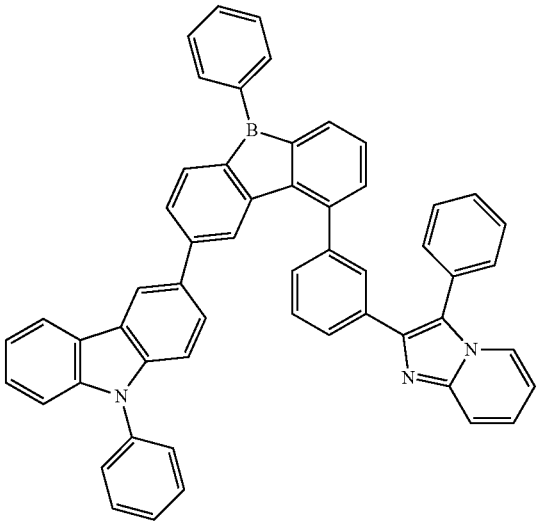

H2-74
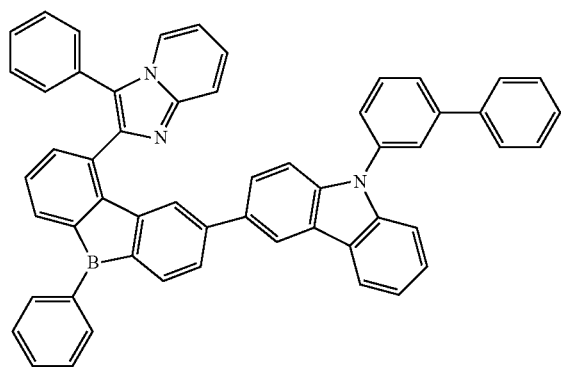
H2-77
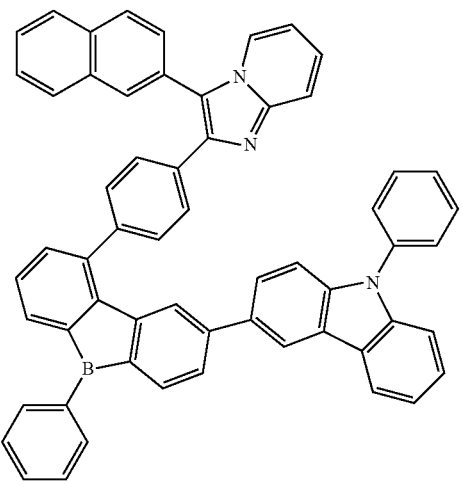
H2-75
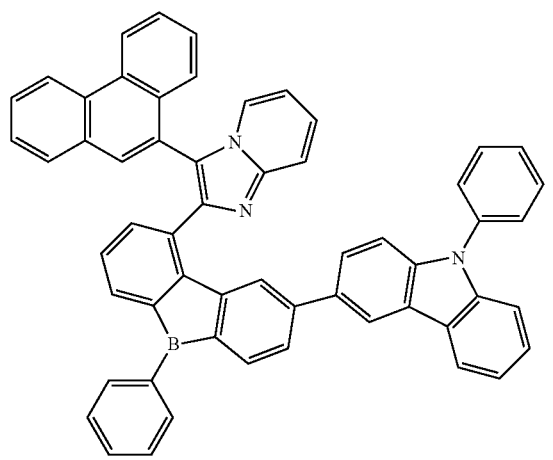
H2-78
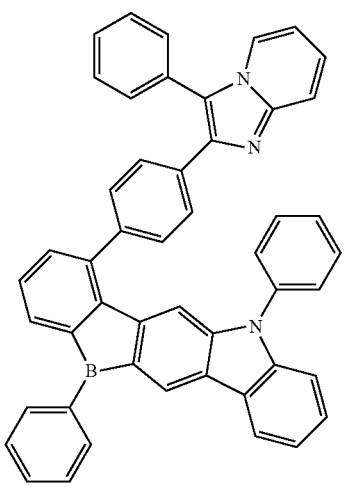
H2-76
H2-79
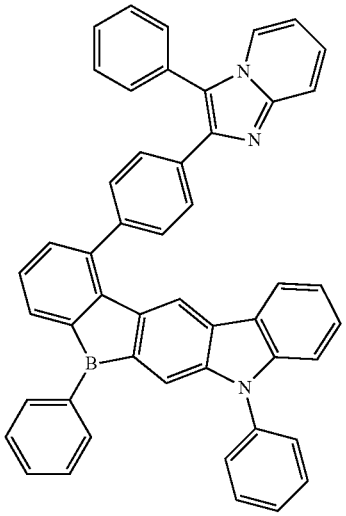

H2-80

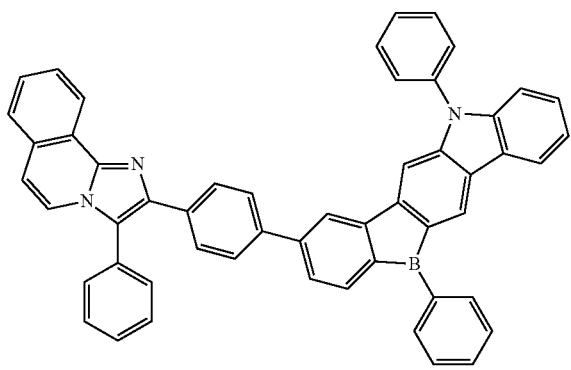

H2-81

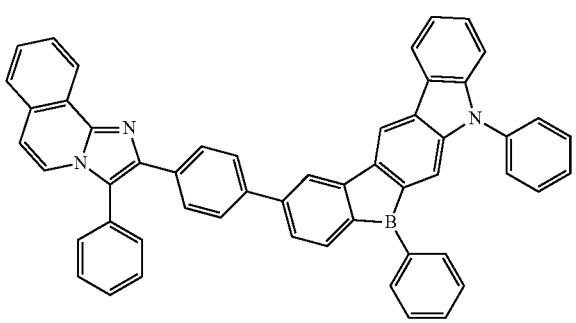

H2-82

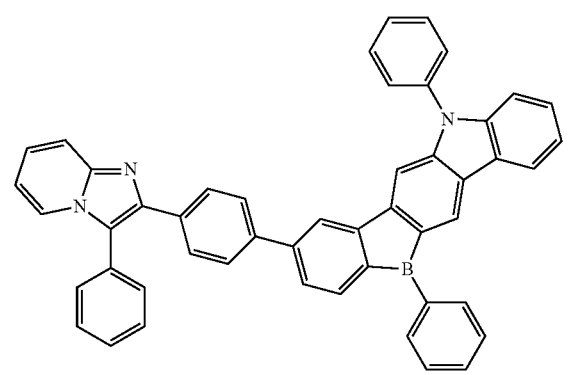

H2-83

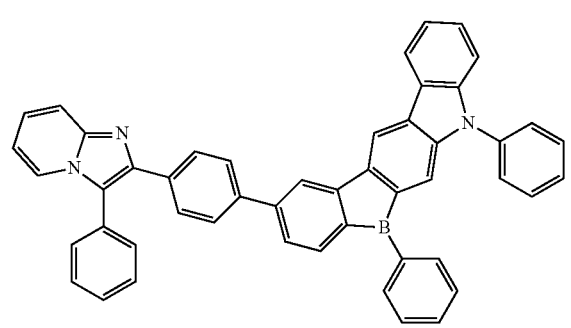

H2-84

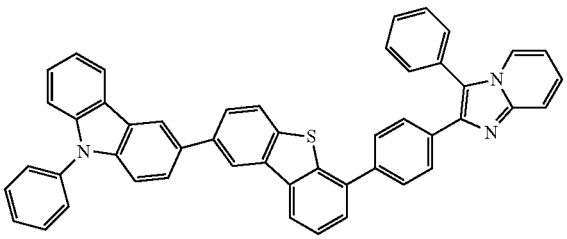

H2-85

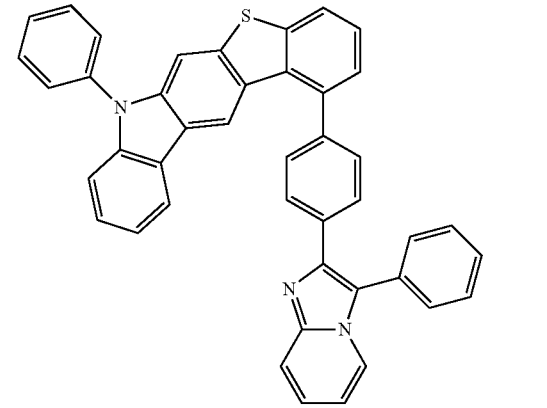

H2-86

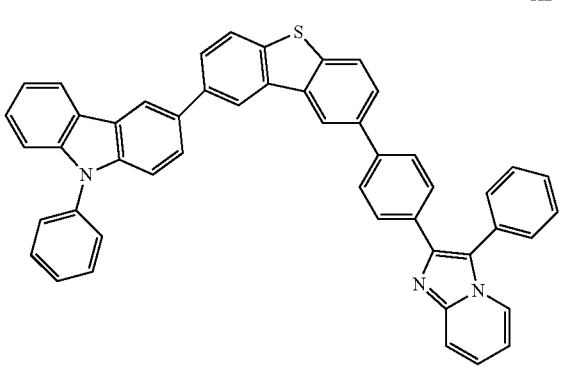

15. An application of the compound of claim 1 in an organic light-emitting device.

16. An organic light-emitting device, comprising:
at least one light-emitting layer placed between a cathode and
an anode or a hole blocking layer between electron transport layers,
wherein:
the compound of claim 1 is located at the light-emitting layer and/or the hole blocking layer.

17. The organic light-emitting device according to claim 16, wherein:
materials of the light-emitting layer comprise a host material and a phosphorescent dopant, and
the compound serves as the host material.

18. The organic light-emitting device according to claim 17, wherein:
the host material comprises a plurality of host compounds;
a first host compound is the compound; and
a second host compound is a compound containing 3,3'-bicarbazole.

19. An application of the compound of claim 2 in an organic light-emitting device.

20. An organic light-emitting device, comprising:
at least one light-emitting layer placed between a cathode and
an anode or a hole blocking layer between electron transport layers,
wherein:
the compound of claim 2 is located at the light-emitting layer and/or the hole blocking layer.

* * * * *